United States Patent
Zhang et al.

(10) Patent No.: US 10,373,969 B2
(45) Date of Patent: Aug. 6, 2019

(54) THREE-DIMENSIONAL MEMORY DEVICE INCLUDING PARTIALLY SURROUNDING SELECT GATES AND FRINGE FIELD ASSISTED PROGRAMMING THEREOF

(71) Applicant: SANDISK TECHNOLOGIES LLC, Plano, TX (US)

(72) Inventors: Yanli Zhang, San Jose, CA (US); Peng Zhang, Fremont, CA (US); Johann Alsmeier, San Jose, CA (US); Yingda Dong, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/865,892

(22) Filed: Jan. 9, 2018

(65) Prior Publication Data
US 2019/0214395 A1    Jul. 11, 2019

(51) Int. Cl.
*G11C 16/04*     (2006.01)
*H01L 27/1157*   (2017.01)
*G11C 16/10*     (2006.01)
*H01L 27/11578*  (2017.01)

(52) U.S. Cl.
CPC ...... *H01L 27/1157* (2013.01); *G11C 16/0466* (2013.01); *G11C 16/0483* (2013.01); *G11C 16/10* (2013.01); *H01L 27/11578* (2013.01)

(58) Field of Classification Search
CPC ................................................ G11C 16/0483
See application file for complete search history.

(56) References Cited

U.S. PATENT DOCUMENTS

| | | |
|---|---|---|
| 5,915,167 A | 6/1999 | Leedy |
| 6,028,788 A | 2/2000 | Choi et al. |
| 6,759,333 B2 | 7/2004 | Okajima et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |

(Continued)

FOREIGN PATENT DOCUMENTS

WO    WO2002/015277 A1    2/2002

OTHER PUBLICATIONS

U.S. Appl. No. 15/286,063, filed Oct. 5, 2016, Sandisk Technologies LLC.

(Continued)

*Primary Examiner* — Hoai V Ho
*Assistant Examiner* — Jay W. Radke
(74) *Attorney, Agent, or Firm* — The Marbury Law Group PLLC

(57) ABSTRACT

A method of operating a three-dimensional memory device includes applying a target string bias voltage to a selected drain select gate electrode which partially surrounds a row of memory stack structures that directly contact a drain select isolation structure, and applying a neighboring string bias voltage that has a greater magnitude than the target string bias voltage to an unselected drain select gate electrode that contacts the drain select level isolation structure.

22 Claims, 28 Drawing Sheets

(56) References Cited

U.S. PATENT DOCUMENTS

| | | | |
|---|---|---|---|
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,349,681 B2 | 1/2013 | Alsmeier et al. | |
| 8,658,499 B2 | 2/2014 | Makala et al. | |
| 9,023,719 B2 | 5/2015 | Pachamuthu et al. | |
| 9,177,966 B1 | 11/2015 | Rabkin et al. | |
| 9,331,094 B2 | 1/2016 | Pachamuthu et al. | |
| 9,305,932 B2 | 4/2016 | Kanakamedala et al. | |
| 9,368,509 B2 | 6/2016 | Pang et al. | |
| 9,449,983 B2 | 9/2016 | Yada et al. | |
| 9,484,296 B2 | 11/2016 | Takahashi et al. | |
| 9,613,975 B2 | 4/2017 | Huang et al. | |
| 9,679,907 B1 | 6/2017 | Kaneko | |
| 9,831,266 B2 | 11/2017 | Kai et al. | |
| 2007/0210338 A1 | 9/2007 | Orlowski | |
| 2007/0252201 A1 | 11/2007 | Kito et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0176440 A1 | 7/2010 | Omura | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0059595 A1 | 3/2011 | Jung | |
| 2011/0076819 A1 | 3/2011 | Kim et al. | |
| 2011/0133606 A1 | 6/2011 | Yoshida et al. | |
| 2011/0198687 A1 | 8/2011 | Lee | |
| 2011/0248327 A1 | 10/2011 | Son et al. | |
| 2011/0266606 A1 | 11/2011 | Park et al. | |
| 2011/0280077 A1 | 11/2011 | Fishburn | |
| 2011/0310670 A1 | 12/2011 | Shim et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0032245 A1 | 2/2012 | Hwang et al. | |
| 2012/0092926 A1 | 4/2012 | Whang | |
| 2012/0146122 A1 | 6/2012 | Whang et al. | |
| 2013/0089974 A1 | 4/2013 | Lee et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2014/0001530 A1 | 1/2014 | Song | |
| 2014/0138760 A1 | 5/2014 | Makala et al. | |
| 2014/0284693 A1 | 9/2014 | Sato et al. | |
| 2015/0076584 A1 | 3/2015 | Pachamuthu et al. | |
| 2015/0179660 A1 | 6/2015 | Yada et al. | |
| 2015/0179662 A1 | 6/2015 | Makala et al. | |
| 2015/0294978 A1 | 10/2015 | Lu et al. | |
| 2015/0348637 A1 | 12/2015 | Han et al. | |
| 2015/0348984 A1 | 12/2015 | Yada et al. | |
| 2015/0380419 A1 | 12/2015 | Gunji-Yoneoka et al. | |
| 2016/0013202 A1 | 1/2016 | Hwang | |
| 2016/0093635 A1 | 3/2016 | Rabkin et al. | |
| 2016/0111437 A1 | 4/2016 | Pang et al. | |
| 2016/0111438 A1 | 4/2016 | Tsutsumi et al. | |
| 2016/0204122 A1 | 7/2016 | Shoji et al. | |
| 2016/0322379 A1 | 11/2016 | Oomori et al. | |
| 2016/0322381 A1 | 11/2016 | Liu et al. | |
| 2016/0351497 A1 | 12/2016 | Peri et al. | |
| 2017/0077108 A1 | 3/2017 | Kawaguchi et al. | |
| 2017/0148808 A1 | 5/2017 | Nishikawa et al. | |
| 2017/0148809 A1 | 5/2017 | Nishikawa et al. | |
| 2017/0148811 A1 | 5/2017 | Zhang et al. | |
| 2017/0179144 A1 | 6/2017 | Han | |
| 2017/0179154 A1 | 6/2017 | Furihata et al. | |
| 2017/0186769 A1 | 6/2017 | Son et al. | |
| 2017/0200501 A1 | 7/2017 | Yang et al. | |
| 2017/0200733 A1 | 7/2017 | Lee | |
| 2017/0278571 A1 | 9/2017 | Chowdhury et al. | |
| 2017/0278859 A1 | 9/2017 | Sharangpani et al. | |
| 2017/0287926 A1 | 10/2017 | Ariyoshi | |
| 2017/0294445 A1 | 10/2017 | Son et al. | |
| 2017/0358594 A1 | 12/2017 | Lu et al. | |
| 2018/0097009 A1* | 4/2018 | Zhang | H01L 27/11582 |
| 2018/0233513 A1* | 8/2018 | Zhang | H01L 27/11582 |

OTHER PUBLICATIONS

U.S. Appl. No. 15/354,795, filed Nov. 17, 2016, Sandisk Technologies LLC.
U.S. Appl. No. 15/468,732, filed Mar. 24, 2017, Sandisk Technologies LLC.
U.S. Appl. No. 15/685,254, filed Aug. 24, 2017, Sandisk Technologies LLC.
U.S. Appl. No. 15/704,286, filed Sep. 14, 2017, Sandisk Technologies LLC.
U.S. Appl. No. 15/784,549, filed Oct. 16, 2017, Sandisk Technologies LLC.
U.S. Appl. No. 15/818,061, filed Nov. 20, 2017, Sandisk Technologies LLC.
U.S. Appl. No. 15/818,146, filed Nov. 20, 2017, Sandisk Technologies LLC.
U.S. Appl. No. 62/248,373, filed Oct. 30, 2015, Ogawa et al.
Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).
Chen et al., "Reliability Characteristics of NiSi Nanocrystals Embedded in Oxide and Nitride Layers for Nonvolatile Memory Application," Applied Physics Letters, 92, 152114 (2008).
Diaz, "Low-k Dielectrics: Materials and Process Technology," EE518, Penn State University, Apr. 13, 2006.
Endoh et al., "Novel Ultra High Density Memory with a Stacked-Surrounding Gate Transistor (S-SGT) Structured Cell," IEDM Proc. (2001) pp. 33-36.
International Application No. PCT/US2017/014172, International Search Report and Written Opinion, dated Jun. 20, 2017, 17pgs.
International Application No. PCT/US2017/014172, Invitation to Pay Additional Fees and Communication, dated Apr. 28, 2017, 12pgs.
International Application No. PCT/US2017/049723, International Search Report and Written Opinion, dated Nov. 16, 2017, 18pgs.
International Search Report and Written Opinion, International Application No. PCT/US2011/042566, dated Jan. 17, 2012.
International Search Report and Written Opinion, International Application No. PCT/US2013/048508, dated Dec. 18, 2013.
Invitation to Pay Additional Fees & Partial International Search Report, PCT/US2011/042566, dated Sep. 28, 2011.
Invitation to Pay Additional Search Fees, International Application No. PCT/2013/048508, dated Sep. 18, 2013.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, M., "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Saraswat, "Low-k Dieletrics," Department of Electrical Engineering, Stanford University, Jul. 2008.
Tanaka et al., "Bit-Cost Scalable Technology for Low-Cost and Ultrahigh-Density Flash Memory," Toshiba Review, vol. 63, No. 2, 2008, pp. 28-31.

(56) References Cited

OTHER PUBLICATIONS

International Search Report and Written Opinion of the International Searching Authority for International Patent Application No. PCT/US2018/060847, dated Mar. 11, 2019, 9 pages.

* cited by examiner

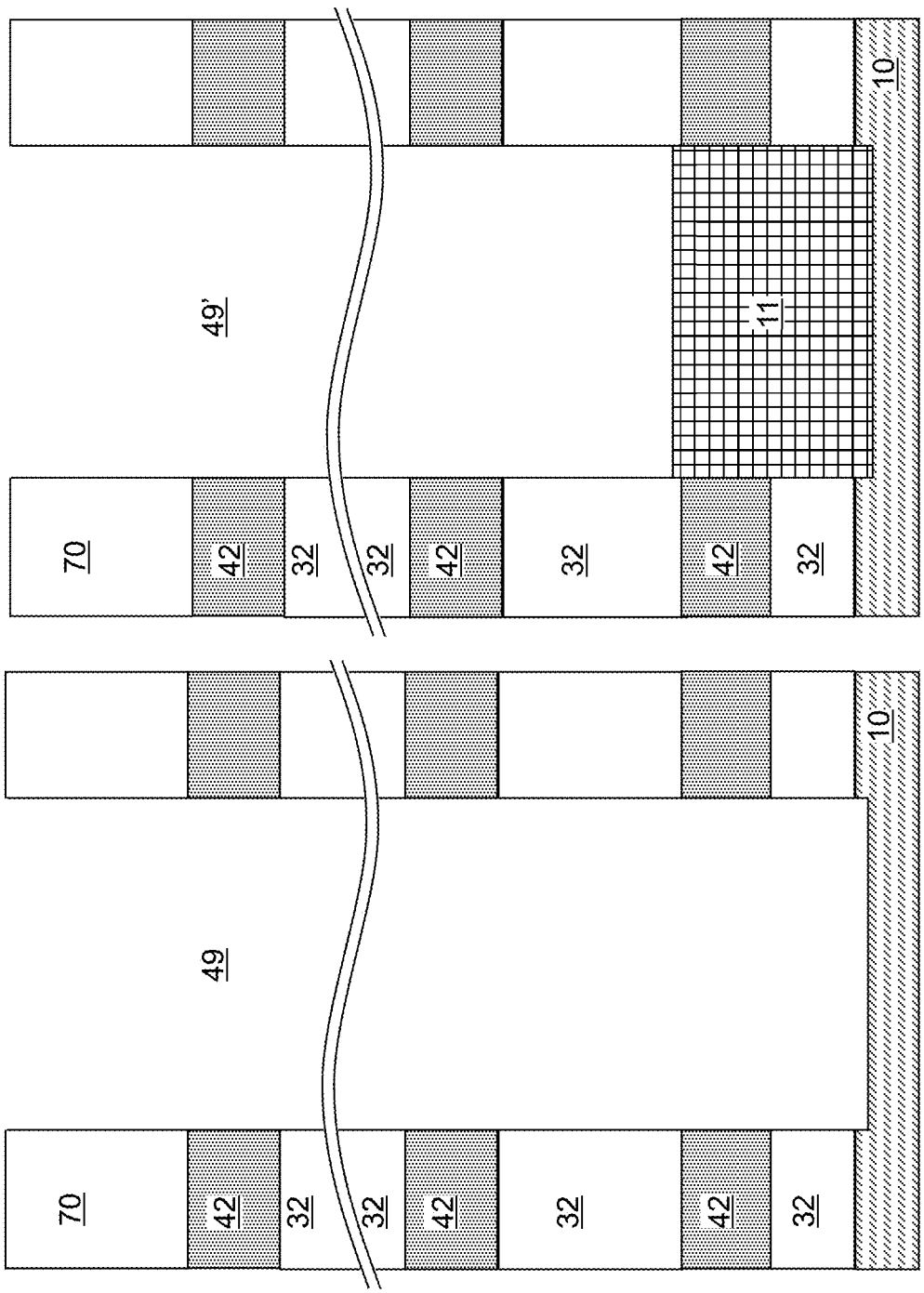

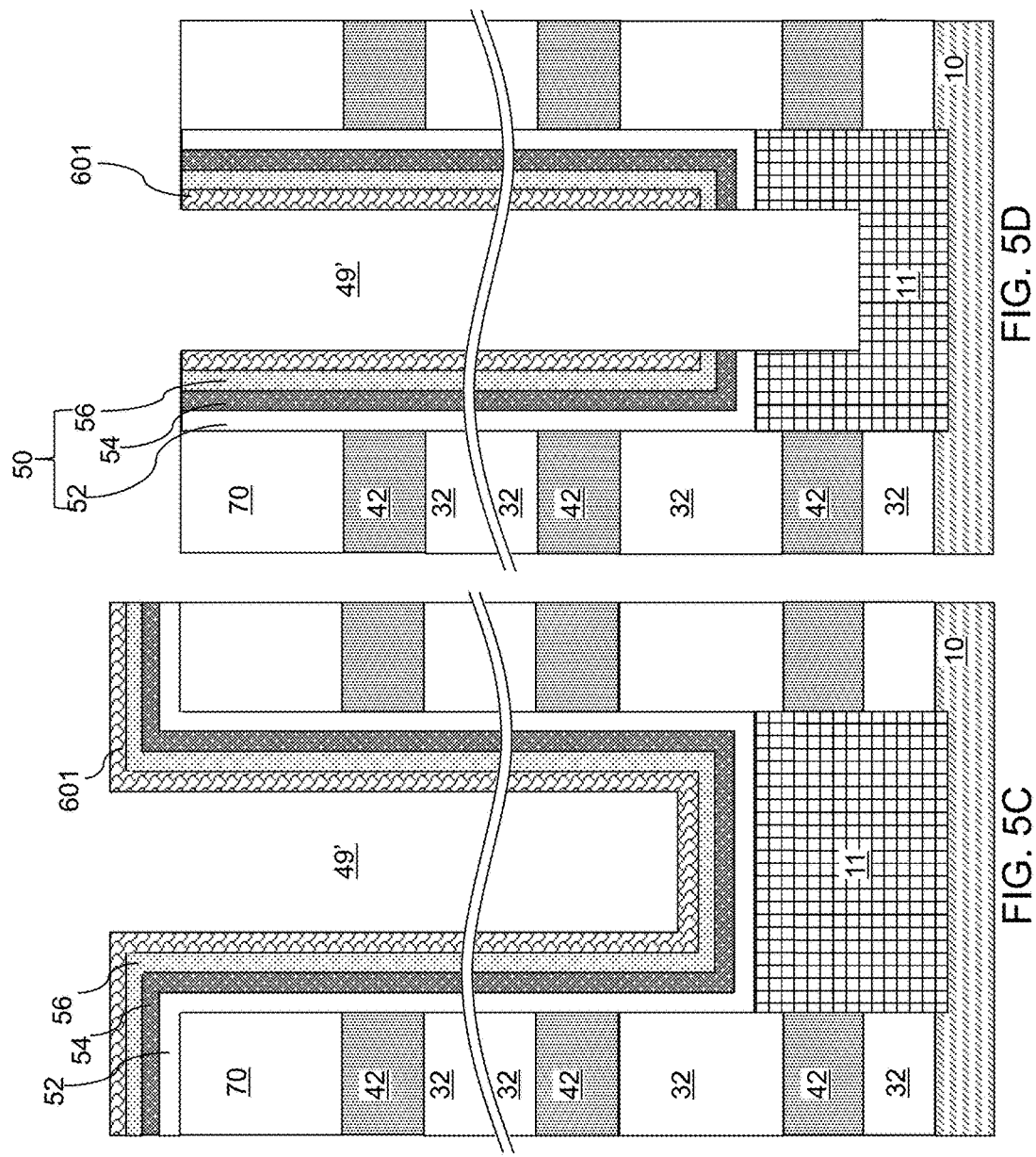

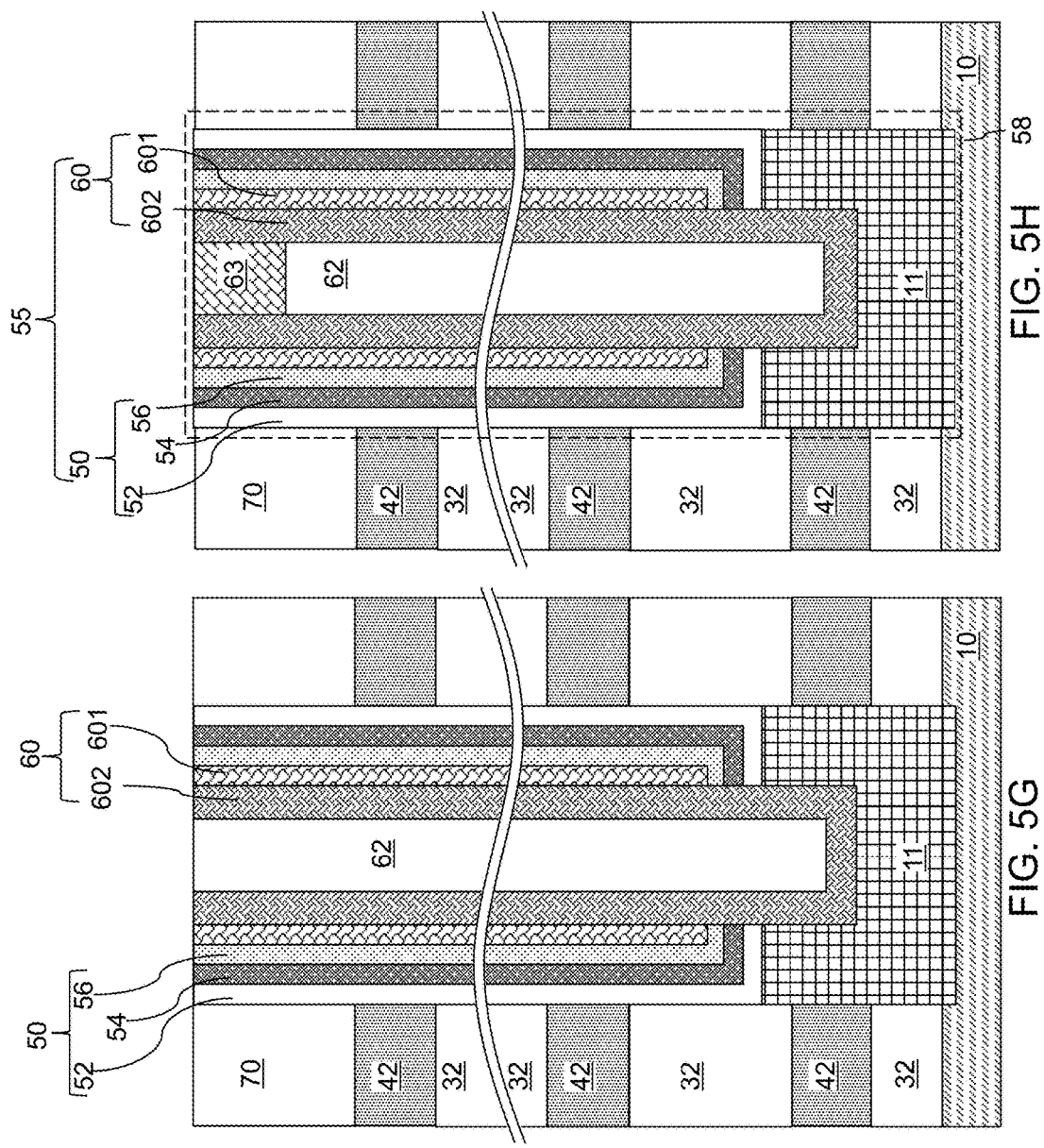

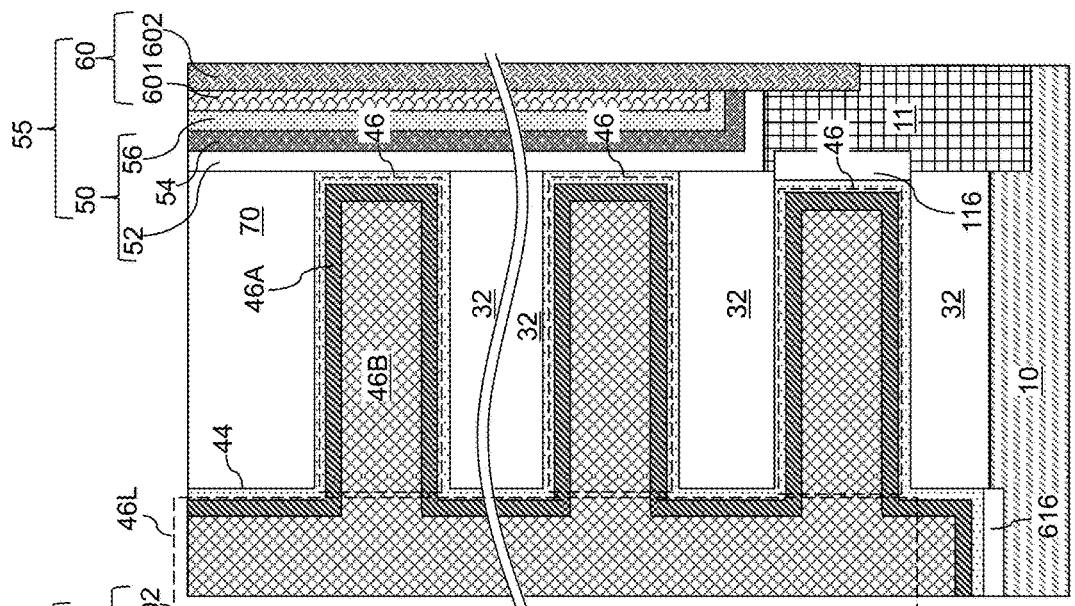
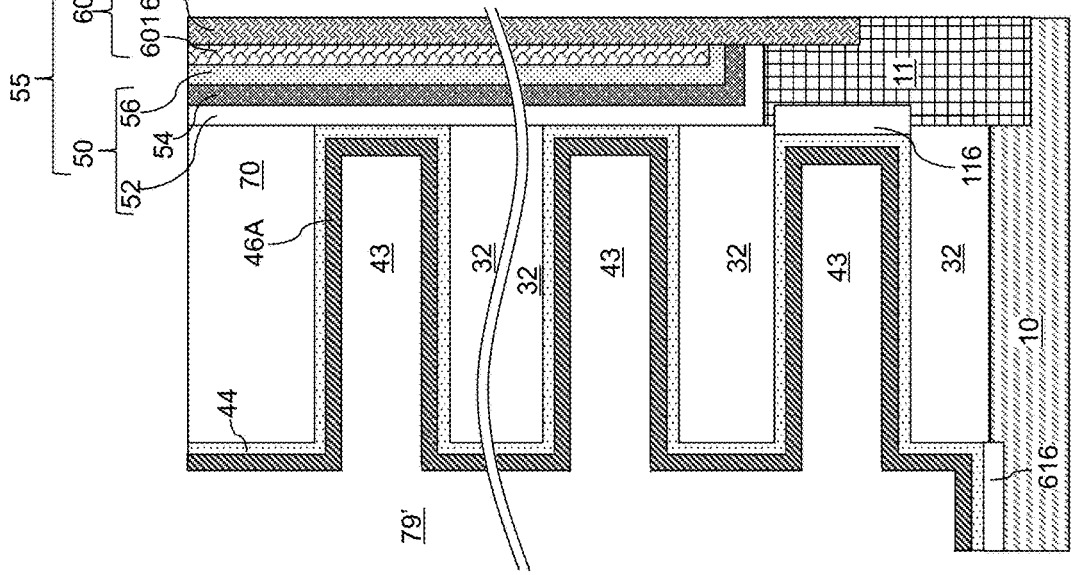

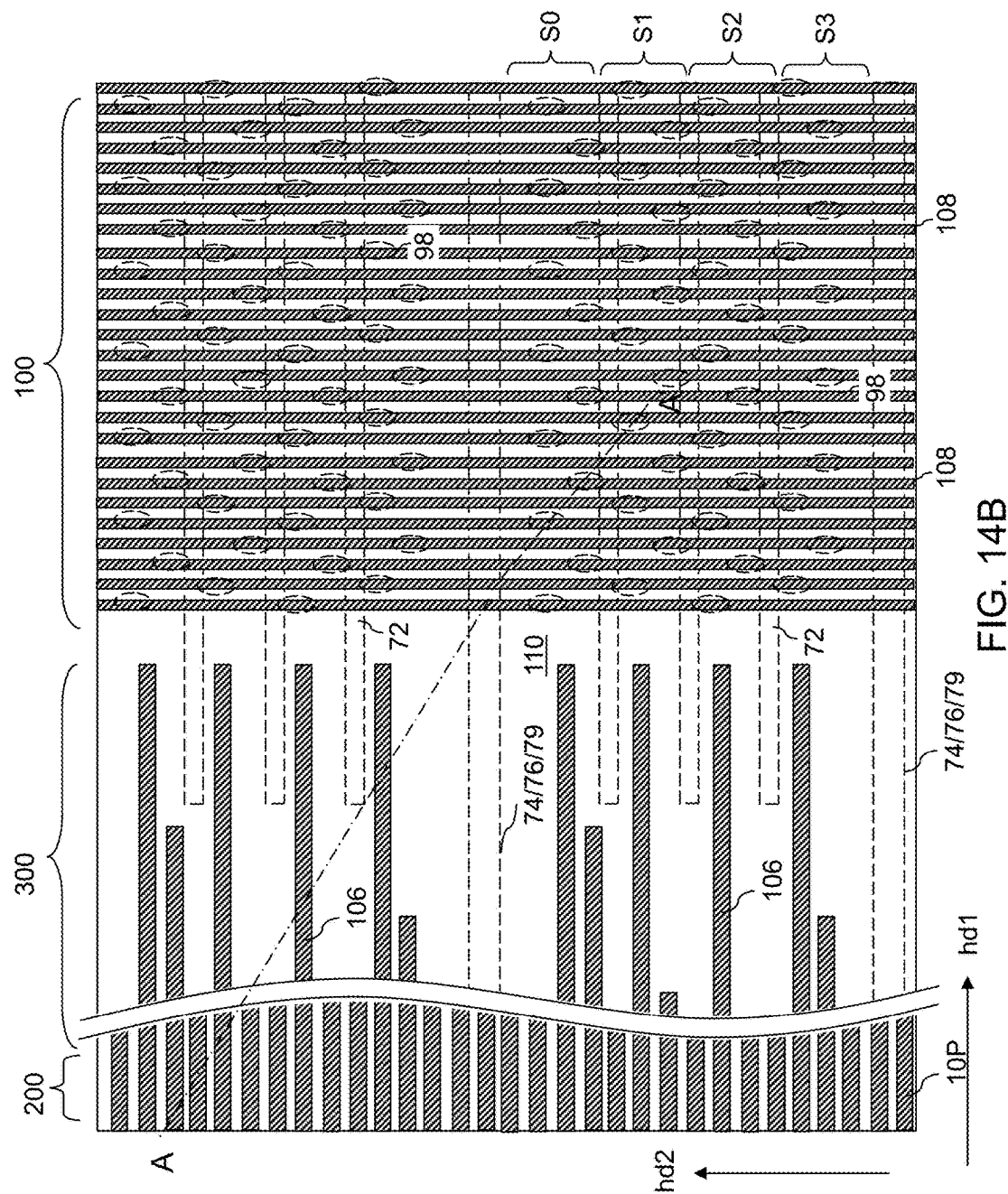

THREE-DIMENSIONAL MEMORY DEVICE INCLUDING PARTIALLY SURROUNDING SELECT GATES AND FRINGE FIELD ASSISTED PROGRAMMING THEREOF

FIELD

The present disclosure relates generally to the field of semiconductor devices, and particular to three-dimensional memory devices and fringe field assisted programming thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of operating a three-dimensional memory device comprises providing a three-dimensional memory device comprising an alternating stack of insulating layers and electrically conductive layers located over a substrate, and memory stack structures extending through the alternating stack. Each of the memory stack structures comprises a memory film that surrounds a vertical semiconductor channel. The electrically conductive layers comprise drain select gate electrodes located over word line electrically conductive layers. The memory stack structures are arranged in multiple groups that are laterally spaced apart by drain select level isolation structures at a level of the drain select gate electrodes. At least one row of memory stack structures is partially surrounded by a respective drain select gate electrode layer section in each of the multiple groups. The at least one row of memory stack structures directly contacts a respective one of the drain select level isolation structures in each of the multiple groups. The method also comprises applying a target string bias voltage to a selected drain select gate electrode layer section which partially surrounds a first row of memory stack structures that directly contact a first one of the drain select isolation structures, and applying a neighboring string bias voltage that has a greater magnitude than the target string bias voltage to a first unselected drain select gate electrode layer section that contacts the first one of the drain select level isolation structures.

According to another aspect of the present disclosure, a three-dimensional memory device comprises an alternating stack of insulating layers and electrically conductive layers located over a substrate, wherein the electrically conductive layers comprise drain select gate electrodes located over word line electrically conductive layers, memory stack structures extending through the alternating stack, wherein each of the memory stack structures comprises a memory film that surrounds a vertical semiconductor channel, the memory stack structures are arranged in multiple groups that are laterally spaced apart by drain select level isolation structures at a level of the drain select gate electrodes, and at least one row of memory stack structures is partially surrounded by a respective drain select gate electrode, drain regions contacting a top end of a respective one of the vertical semiconductor channels, and bit lines that are electrically shorted a respective subset of the drain regions such that each bit line is electrically shorted to only one drain region per each neighboring pair of groups, and each bit line is electrically shorted to more than one drain region in a first memory block.

According to another aspect of the present disclosure, a three-dimensional memory device is provided, which comprises: an alternating stack of insulating layers and electrically conductive layers located over a substrate, and memory stack structures extending through the alternating stack, wherein each of the memory stack structures comprises a memory film that surrounds a vertical semiconductor channel, wherein the memory stack structures are arranged in multiple groups that are laterally spaced apart by drain select level isolation structures at a drain select level, and wherein at least one row of memory stack structures directly contacts a respective one of the drain select level isolation structures in each of the multiple groups; and a control circuitry configured to provide charge injection into the memory films at the drain select level. The control circuitry comprises: a target string bias voltage supply circuitry configured to generate a target string bias voltage; a neighboring string bias voltage supply circuitry configured to generate a neighboring string bias voltage; a pass bias voltage supply circuitry configured to generate a pass bias voltage, wherein the neighboring string bias voltage is different from the pass bias voltage; a programming drain bias voltage circuitry configured to generate a programming drain bias voltage; and an address decoder and a switch circuitry that are configured: to apply the target string bias voltage to a selected drain select gate electrode layer section; to apply the neighboring string bias voltage to a first unselected drain select gate electrode that contacts a first one of the drain select level isolation structures that contacts the selected drain select gate electrode; to apply the pass bias voltage to a second unselected drain select gate electrode layer section that is laterally spaced from the selected drain select gate electrode by at least one group; and to apply the programming drain bias voltage to a vertical semiconductor channel within a selected memory stack structure laterally surrounded by the selected drain select gate electrode layer section.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 14B is a top-down view of the exemplary structure of FIG. 14A.

DETAILED DESCRIPTION

Figure 1:
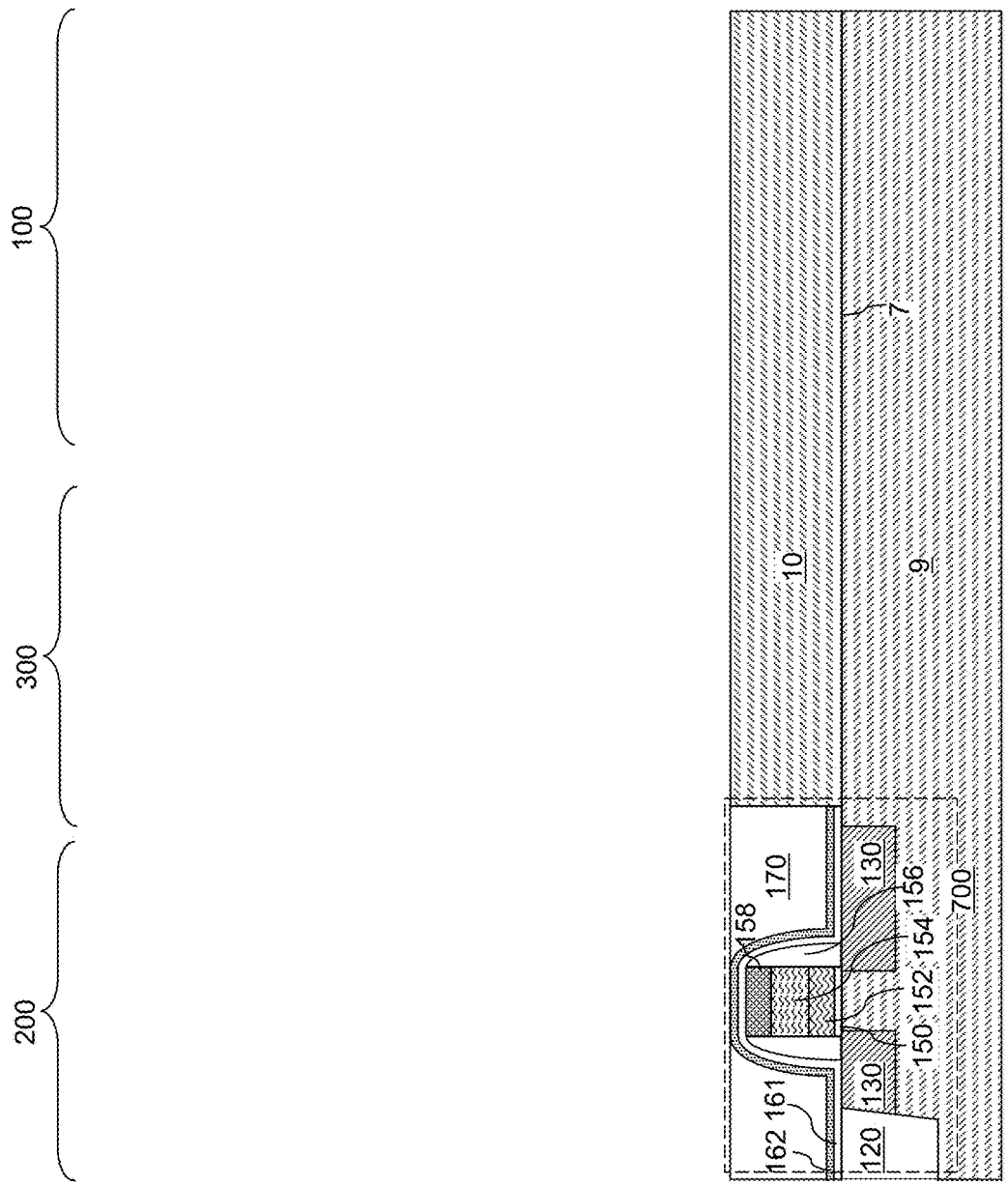
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device containing partially surrounding drain select gates and method of fringe field assisted programming thereof, the various aspects of which are described below. The embodiments of the disclosure can be employed to form and operate various structures including a multilevel memory structure, non-limiting examples of which include semiconductor devices such as three-dimensional monolithic memory array devices comprising a plurality of NAND memory stings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
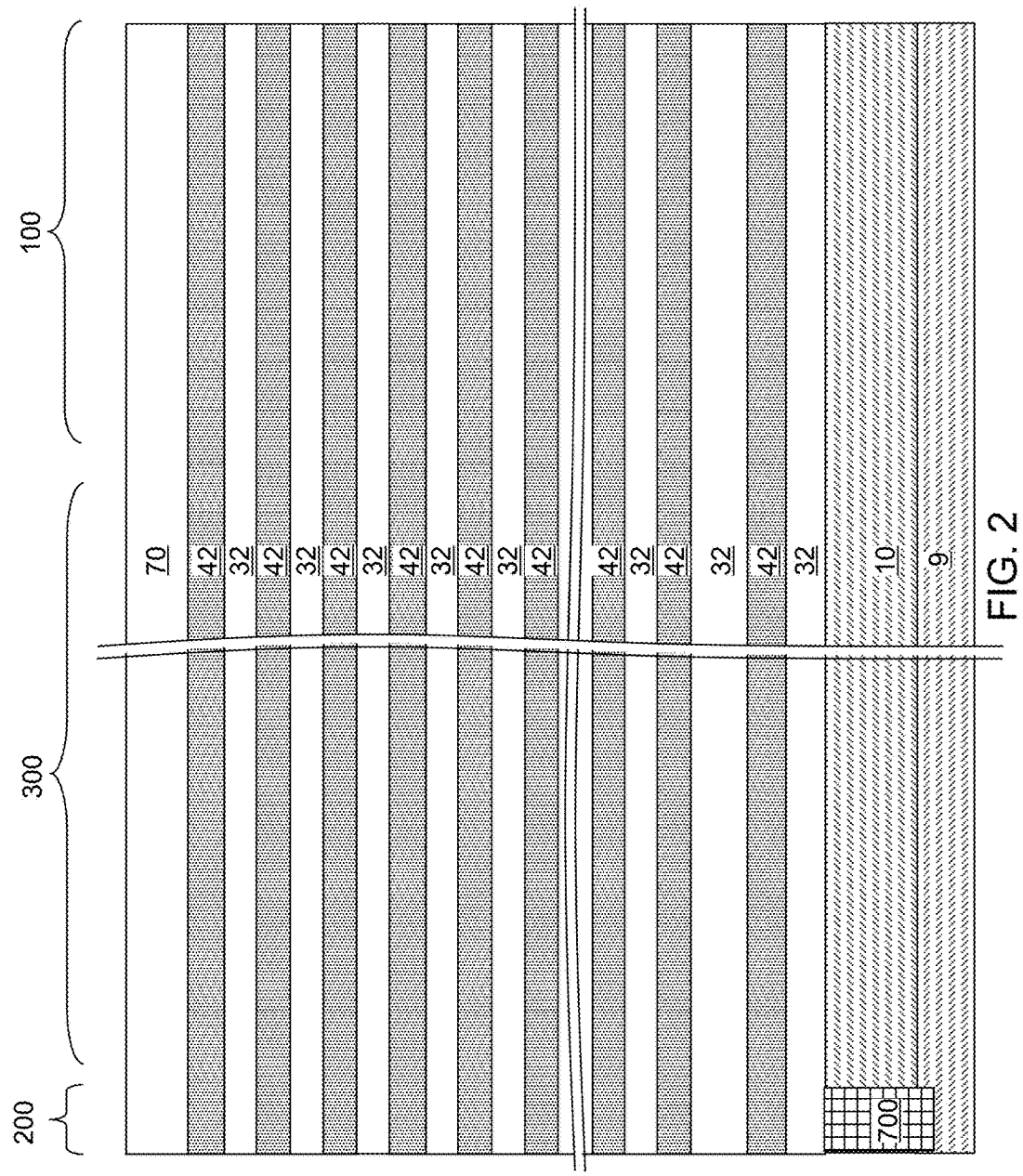
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
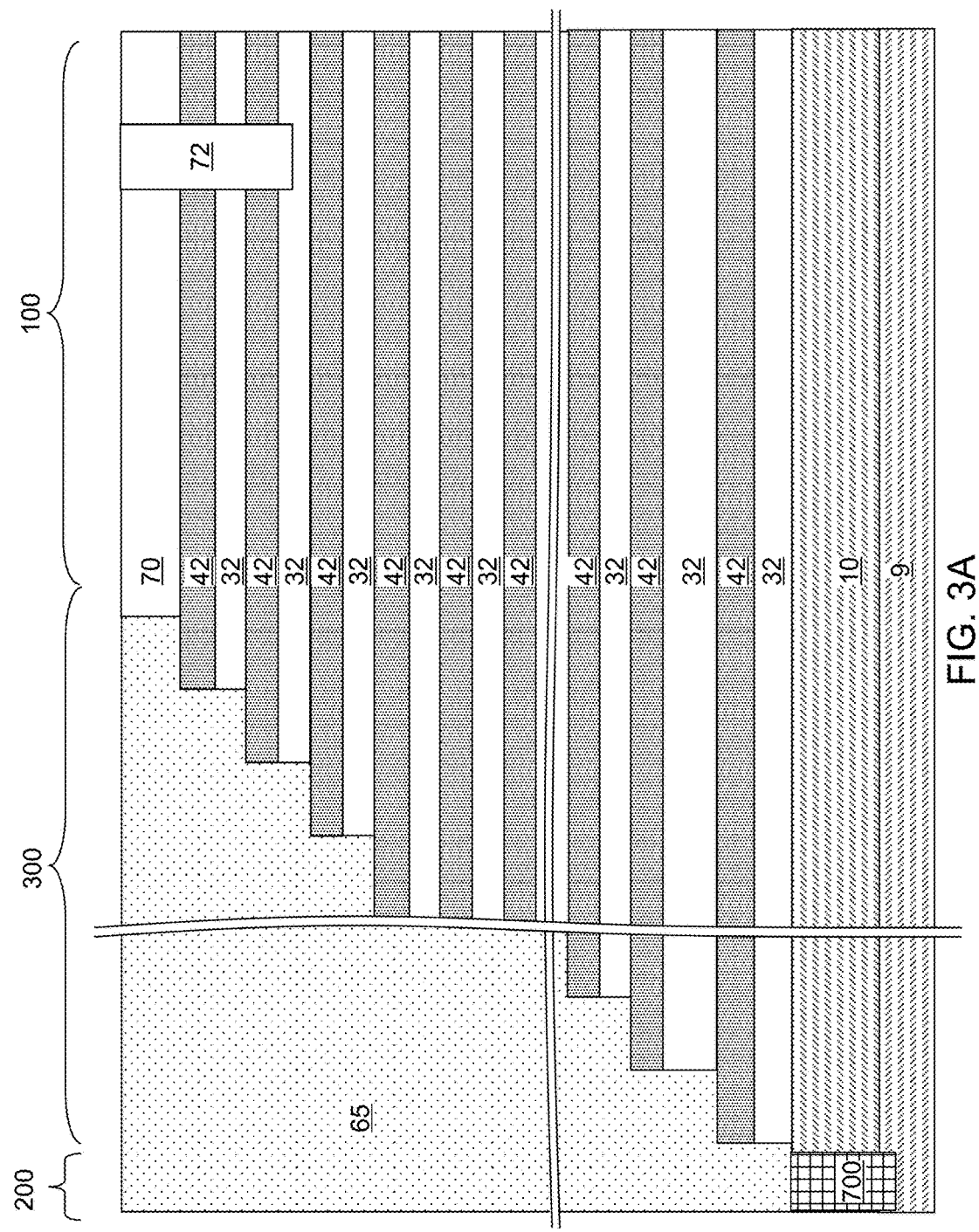
FIG. 3A is a schematic vertical cross-sectional view of the exemplary structure after formation of stepped terraces, a retro-stepped dielectric material portion, and drain select level isolation structures according to an embodiment of the present disclosure.
Figure 3B:
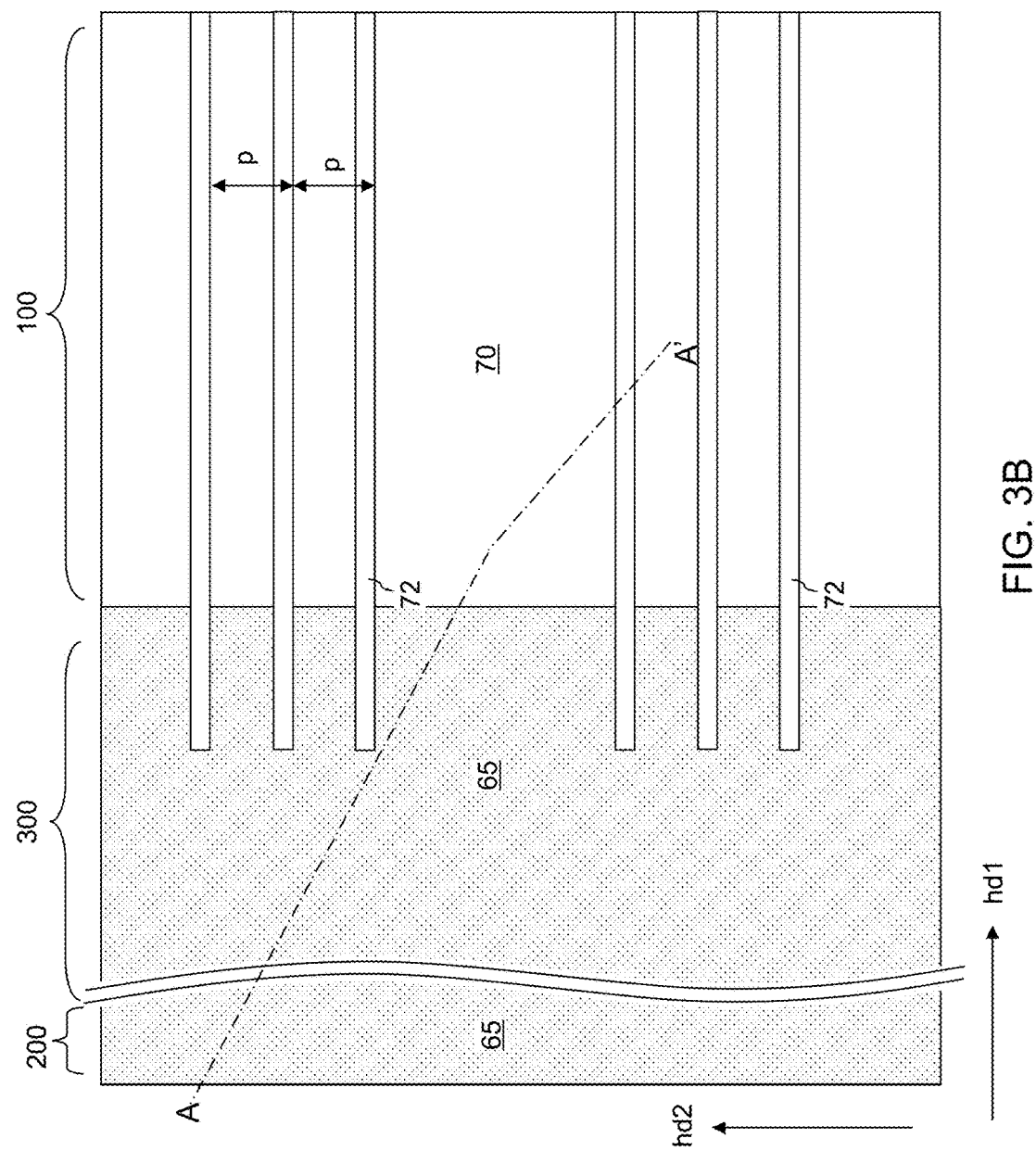
FIG. 3B is a top-down view of the exemplary structure of FIG. 3A. The vertical plane A-A' is the plane of the cross-section for FIG. 3A.

Referring to FIGS. 3A and 3B, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Drain select level isolation structures 72 can be formed through the insulating cap layer 70 and a subset of the sacrificial material layers 42 located at drain select levels. As used herein, a "drain select level" refers to a level at which drain select gate electrodes that activates a respective group of memory stack structures are to be subsequently formed. The drain select level isolation structures 72 can be formed, for example, by applying and patterning a photoresist layer to form elongated openings that extend along a first horizontal direction hd1 (e.g., word line direction) that is the same as the general horizontal direction along which the height of the stepped surfaces change in the terrace region. Line trenches, which are herein referred to as drain select level isolation trenches, are formed by an anisotropic etch process, which transfers the pattern in the photoresist layer through the insulating cap layer 70 and the subset of the sacrificial material layers 42 and any intervening insulating layers 32. The photoresist layer can be subsequently removed, for example, by ashing. Each drain select level isolation trench can have a uniform vertical cross-sectional view within vertical planes that are perpendicular to the first horizontal direction hd1 (e.g., word line direction). In other words, the vertical cross-sectional shape of each drain select level isolation trench within planes perpendicular to the first horizontal direction hd1 can be invariant with translation along the first horizontal direction.

The drain select level isolation trenches can be filled with a dielectric material such as a dielectric oxide, for example silicon oxide. Excess portions of the dielectric material may be optionally removed from above the insulating cap layer 70 by a planarization process, which may employ a recess etch or chemical mechanical planarization. Each portion of the dielectric material filling the drain select level isolation trenches constitutes a drain select level isolation structure 72. Each drain select level isolation structure 72 can be a rail structure laterally extending along the first horizontal direction hd1. As used herein, a "rail structure" refers to a structure that laterally extends along a horizontal direction and optionally having an invariant vertical cross-sectional shape within vertical planes that are perpendicular to the horizontal direction, i.e., a vertical cross-sectional shape that optionally does not change with translation along the horizontal direction. In one embodiment, the drain select level isolation structures 72 can have the same vertical cross-sectional shape within vertical planes that are perpendicular to the first horizontal direction hd1. In addition, drain select level isolation structures 72 can be arranged in groups such that the set of all drain select level isolation structures 72 within a same group are spaced among one another with a uniform pitch along the second horizontal direction hd2 (e.g., bit line direction) which is perpendicular to the first horizontal direction hd1.

Figure 4A:
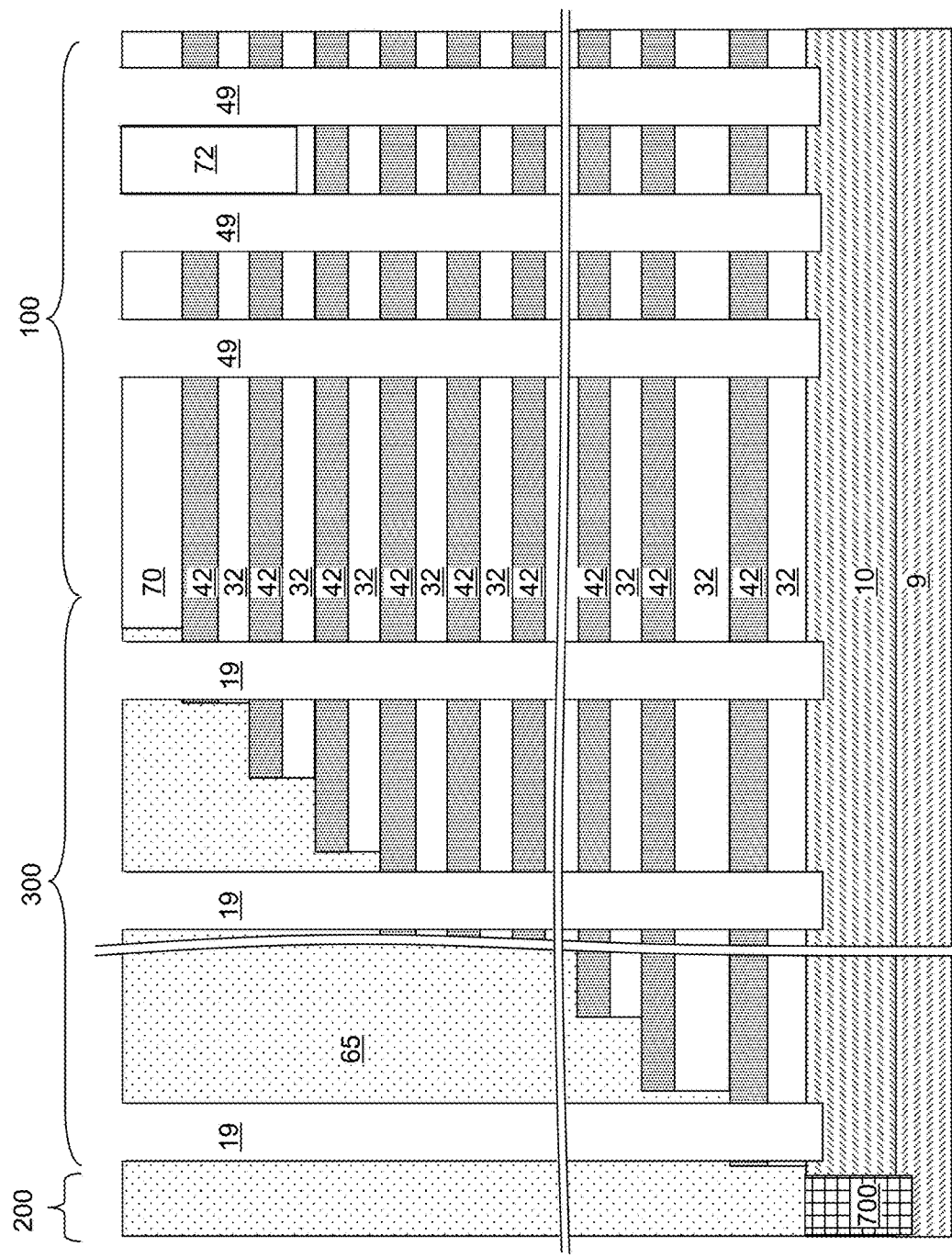
FIG. 4A is a schematic vertical cross-sectional view of the exemplary structure after formation of memory openings and support openings according to an embodiment of the present disclosure.
Figure 4B:
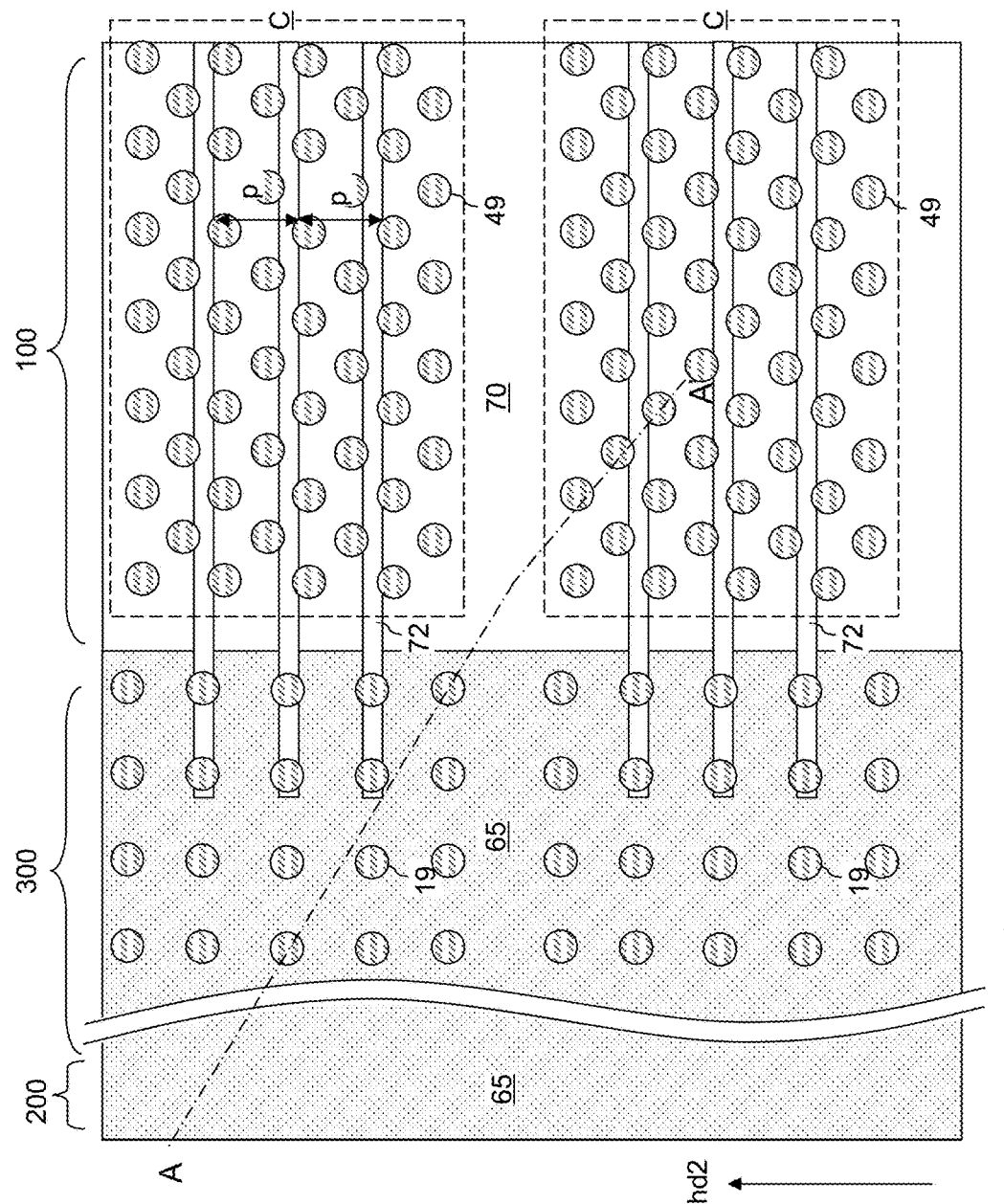
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

The memory openings 49 can be arranged as rows that extend along the first horizontal direction hd1. The memory openings 49 can be formed as multiple clusters C such that each cluster C of memory openings 49 includes multiple rows of memory openings 49. Each cluster C of memory openings 49 can be located in an area in which the drain select level isolation structures 72 are laterally spaced apart by the uniform pitch p. In one embodiment, the inter-row pitch of the memory openings 49 can be the same within each cluster of memory openings 49. In other words, the center-to-center distance between each neighboring pairs of rows of memory openings 49 within each cluster C of memory openings 49 can be the same throughout the cluster C of memory openings 49.

In one embodiment, the inter-row pitch of the memory openings 49 and the pitch p of the drain select level isolation structures 72 can be commensurate. As used herein, a first number and a second number are "commensurate" if the ratio of the first number to the second number is a rational number. In one embodiment, the pitch p of the drain select level isolation structures 72 within a cluster C of memory openings 49 can be an integer multiple of the inter-row pitch of the memory openings 49 in the cluster C of memory openings 49. In one embodiment, the pitch p of the drain select level isolation structures 72 within a cluster C of memory openings 49 can be twice, three times, four times, five times, or six times, the inter-row pitch of the memory openings 49 in the cluster C of memory openings 49. In one embodiment, the pitch p of the drain select level isolation structures 72 within a cluster C of memory openings 49 can be twice the inter-row pitch of the memory openings 49 in the cluster C of memory openings 49.

In one embodiment, two rows of memory openings 49 that are most proximate to each drain select level isolation structure 72 can cut through lengthwise sidewalls of the drain select level isolation structures 72. This configuration provides the advantage of eliminating areal increase in the device size due to formation of the drain select level isolation structures 72. In this case, each lengthwise sidewall of the drain select level isolation structures 72 includes a laterally alternating sequence of planar sidewall portions of concave sidewall portions. Each planar sidewall portion includes a planar (i.e., two-dimensional) interface between the drain select level isolation structure 72 and the insulating cap layer 70, and each concave sidewall portion includes a concave cylindrical interface between the drain select level isolation structure 72 and a memory opening 49. Each memory opening 49 that is not located within two outermost rows in a cluster C of memory openings 49 can cut through a drain select level isolation structure 72, and include a concave sidewall portion of the drain select level isolation structure 72 as a portion of a sidewall of the memory opening 49.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
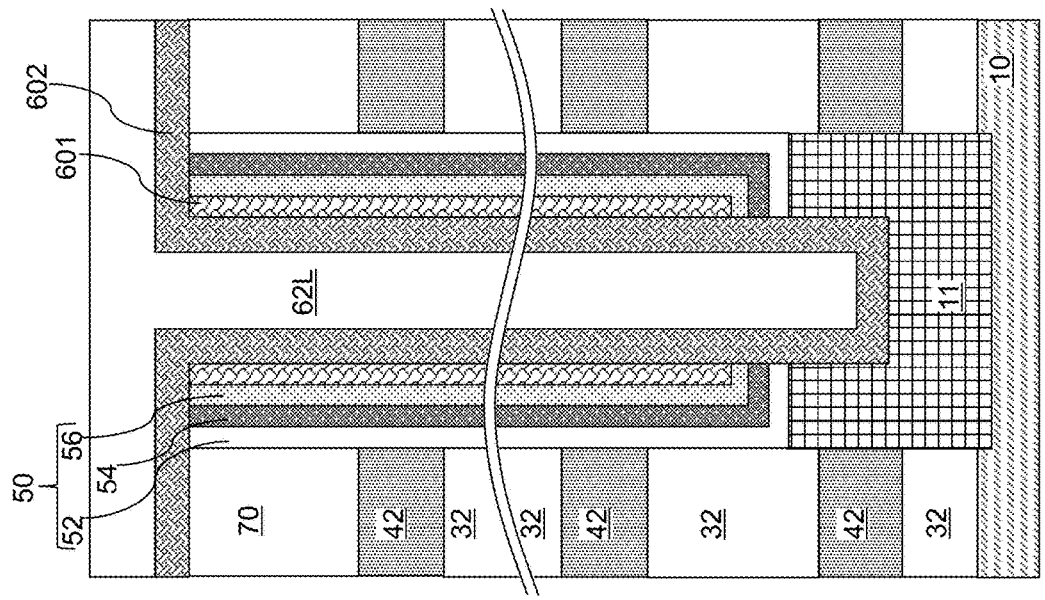
Figure 5E:
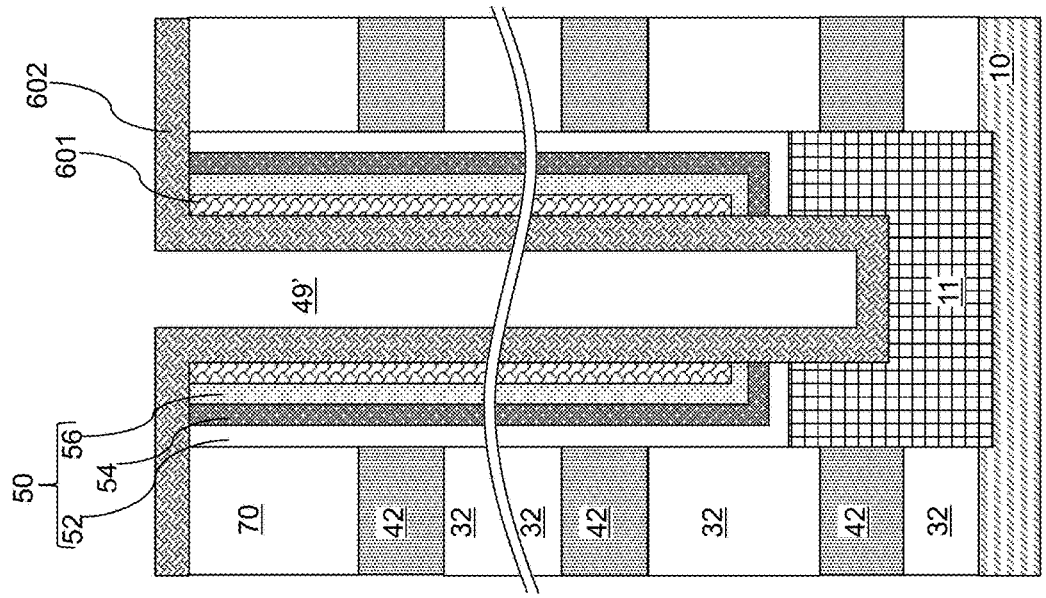

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
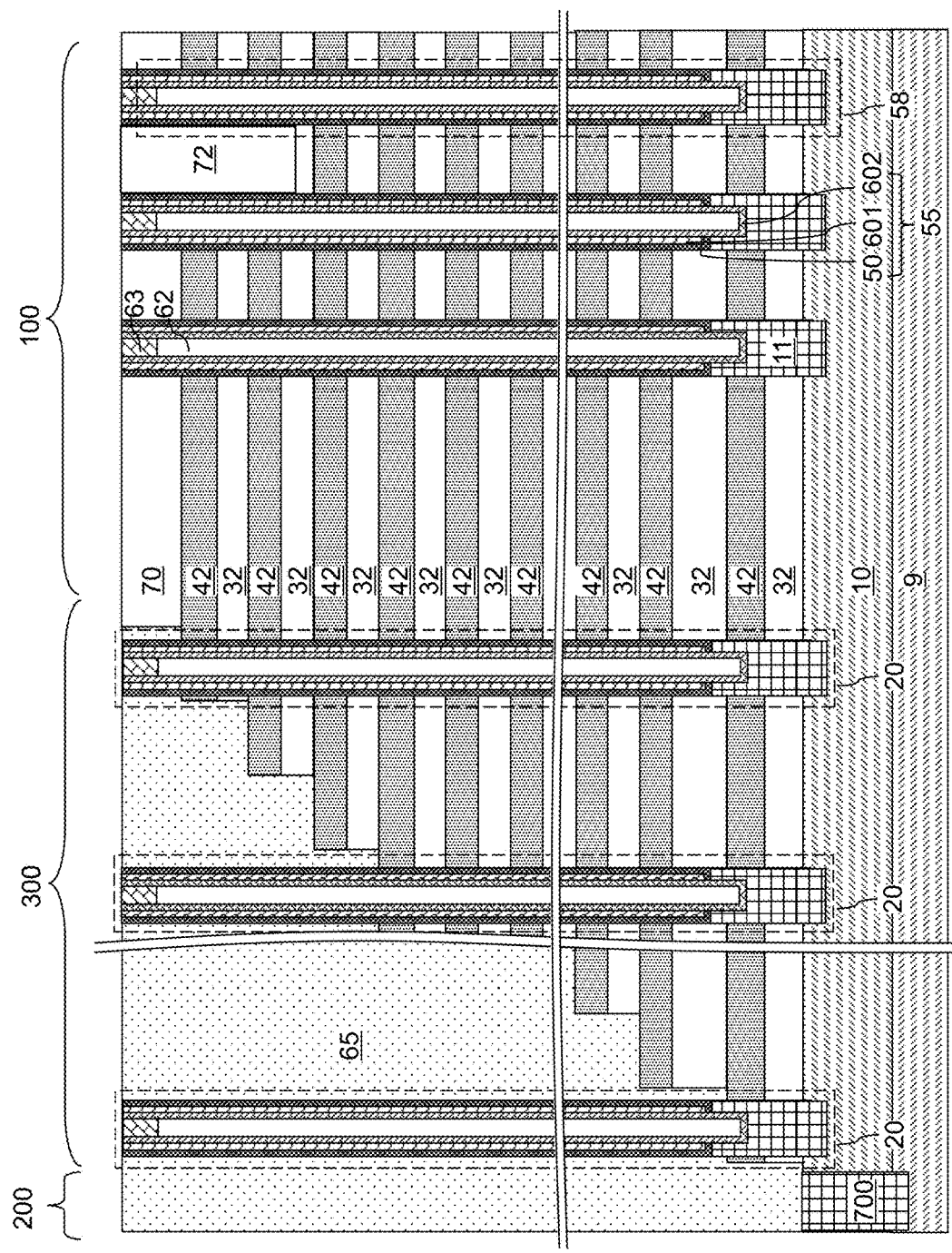
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
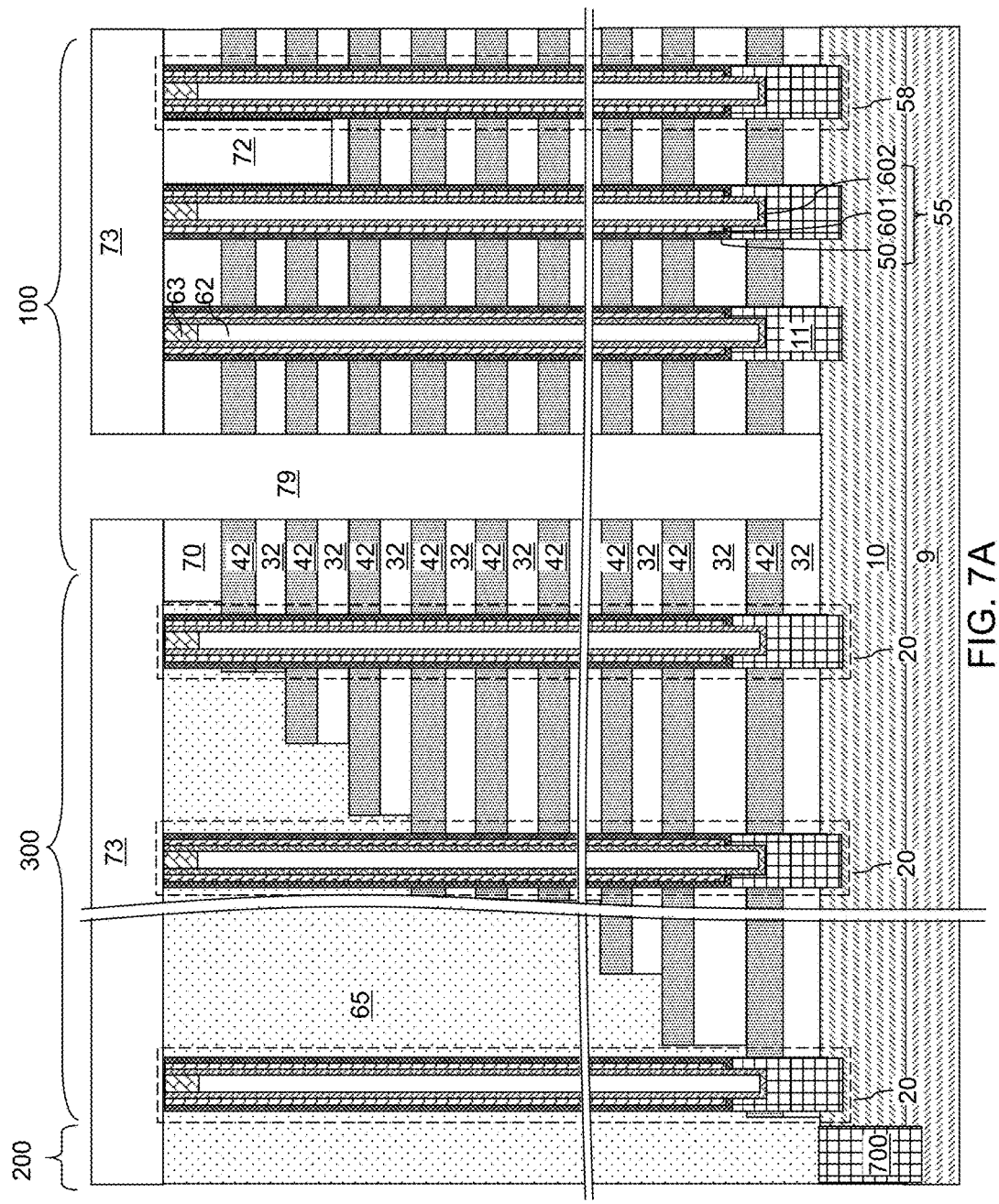
FIG. 7A is a schematic vertical cross-sectional view of the exemplary structure after formation of backside trenches according to an embodiment of the present disclosure.
Figure 7B:
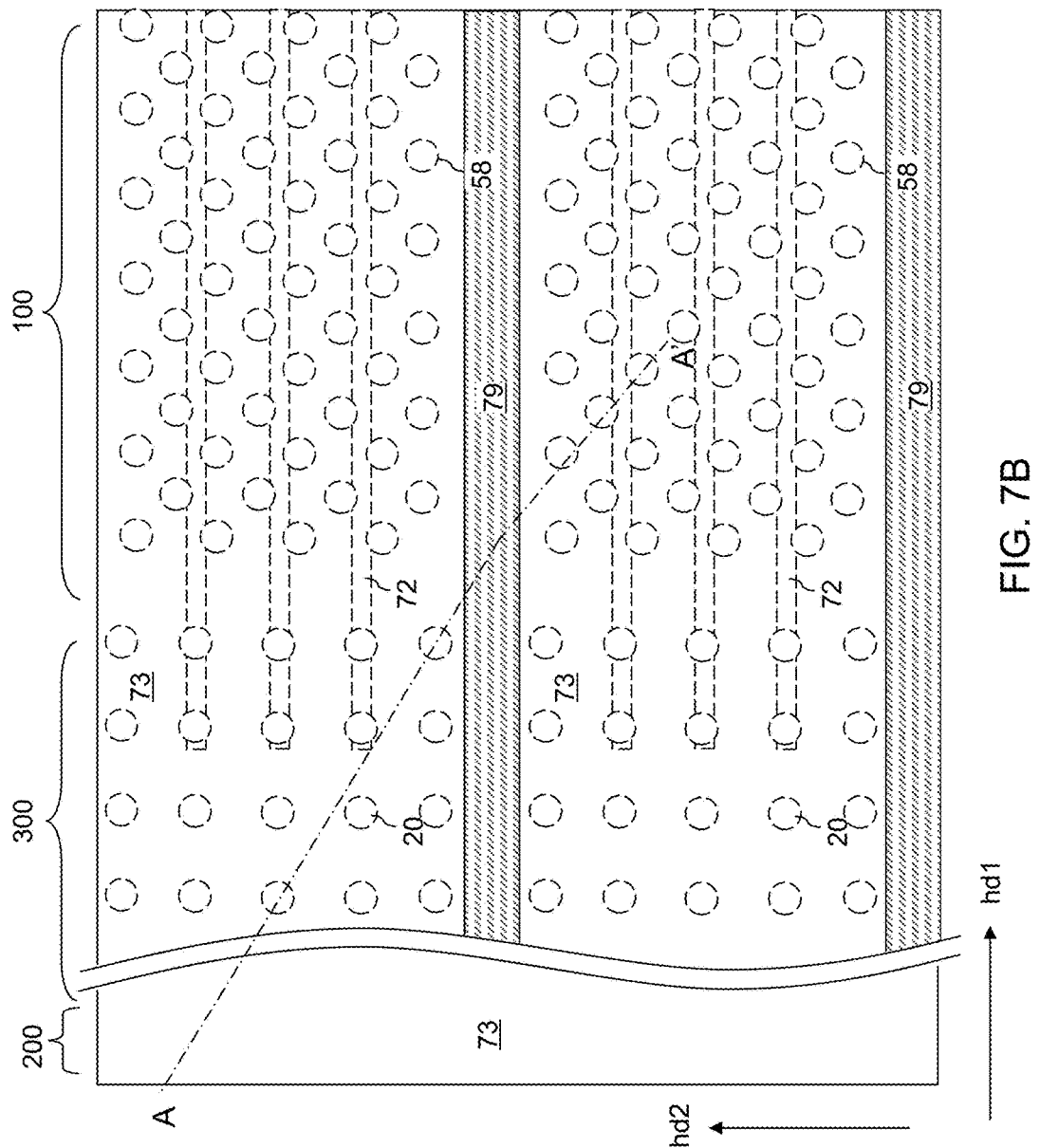
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
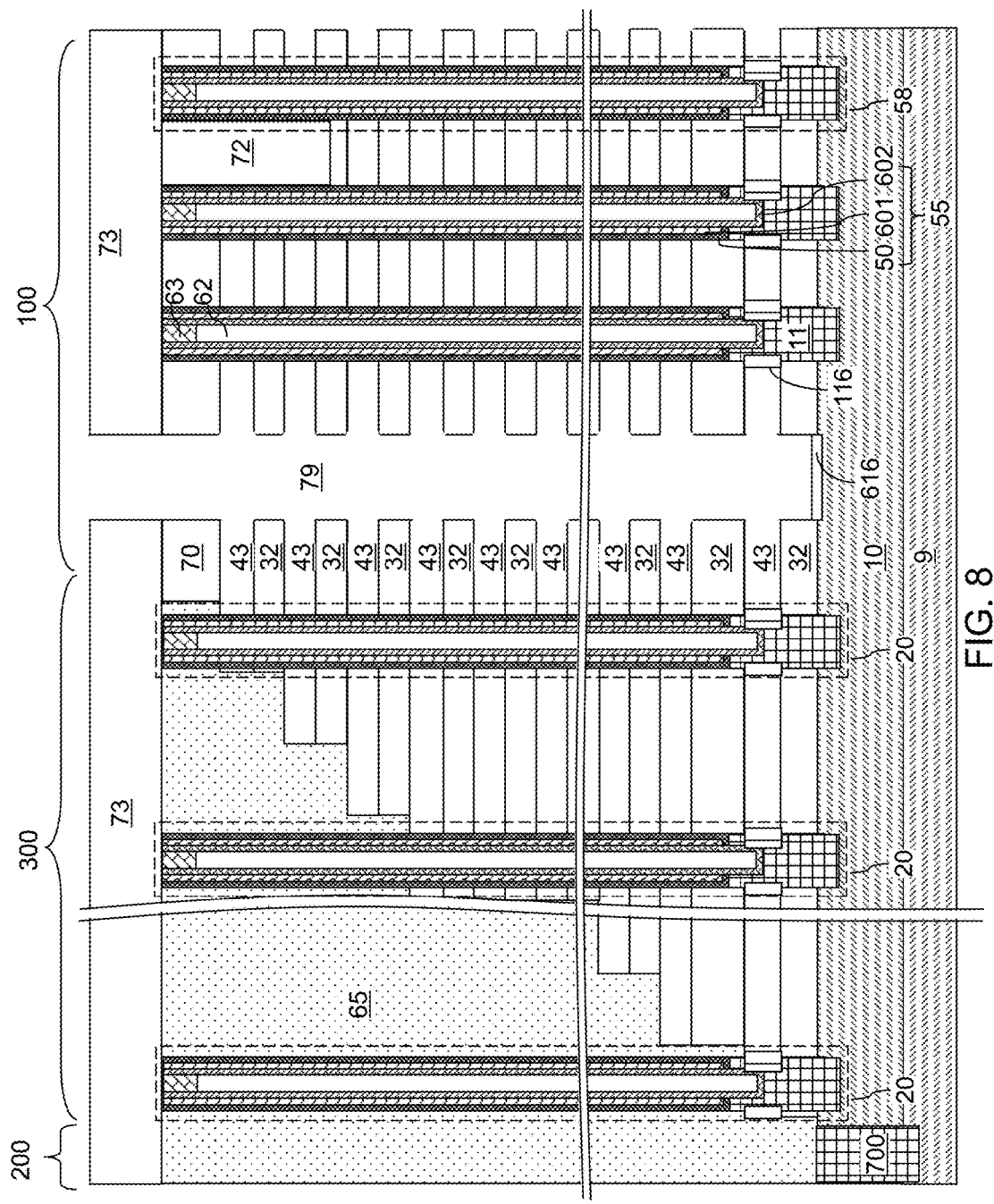
FIG. 8 is a schematic vertical cross-sectional view of the exemplary structure after formation of backside recesses according to an embodiment of the present disclosure.
Figure 9B:
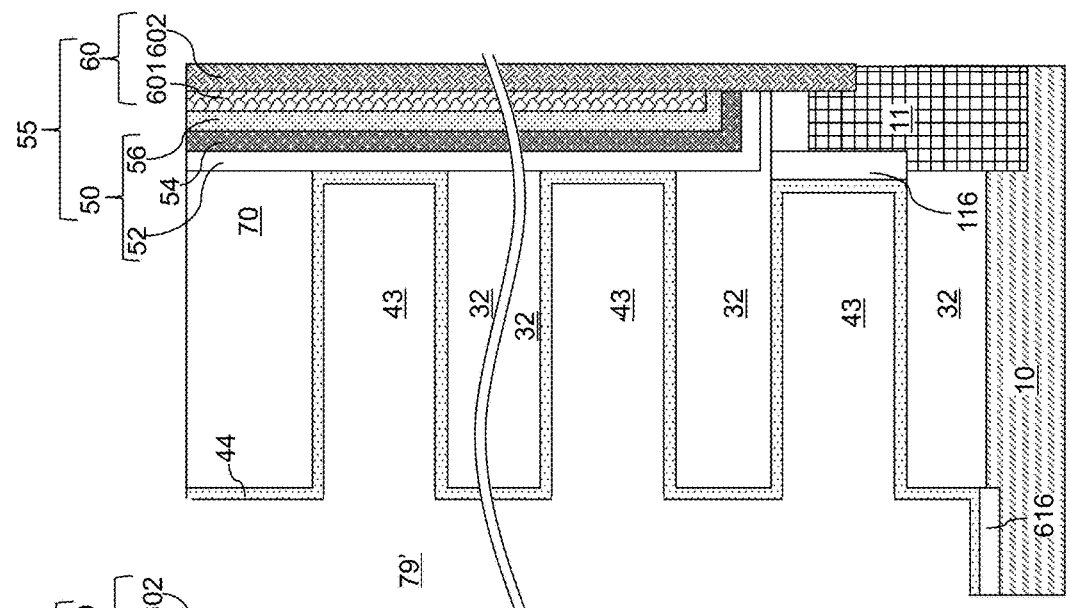
Figure 9A:
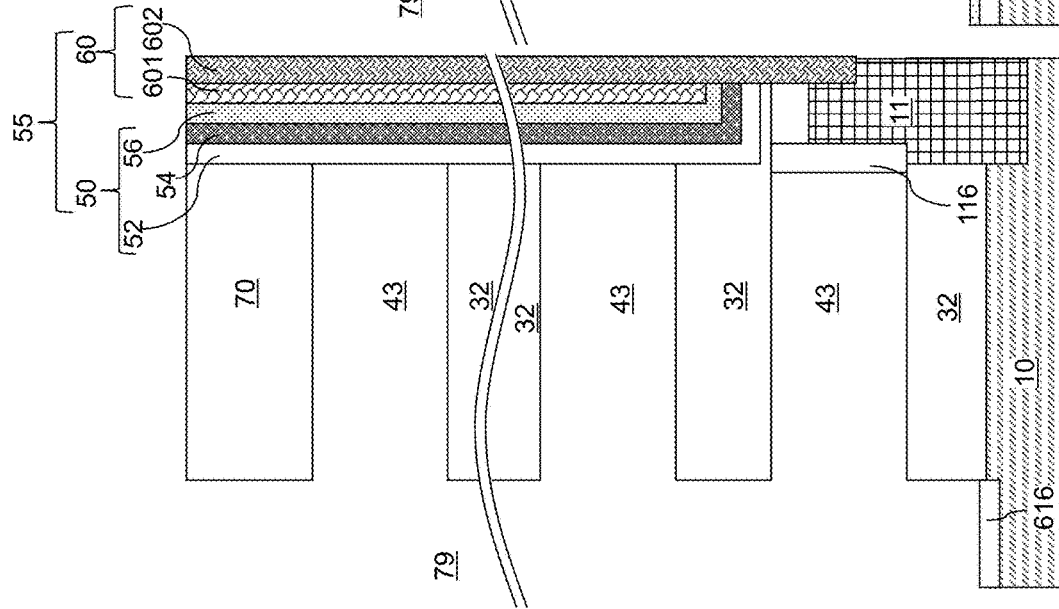

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
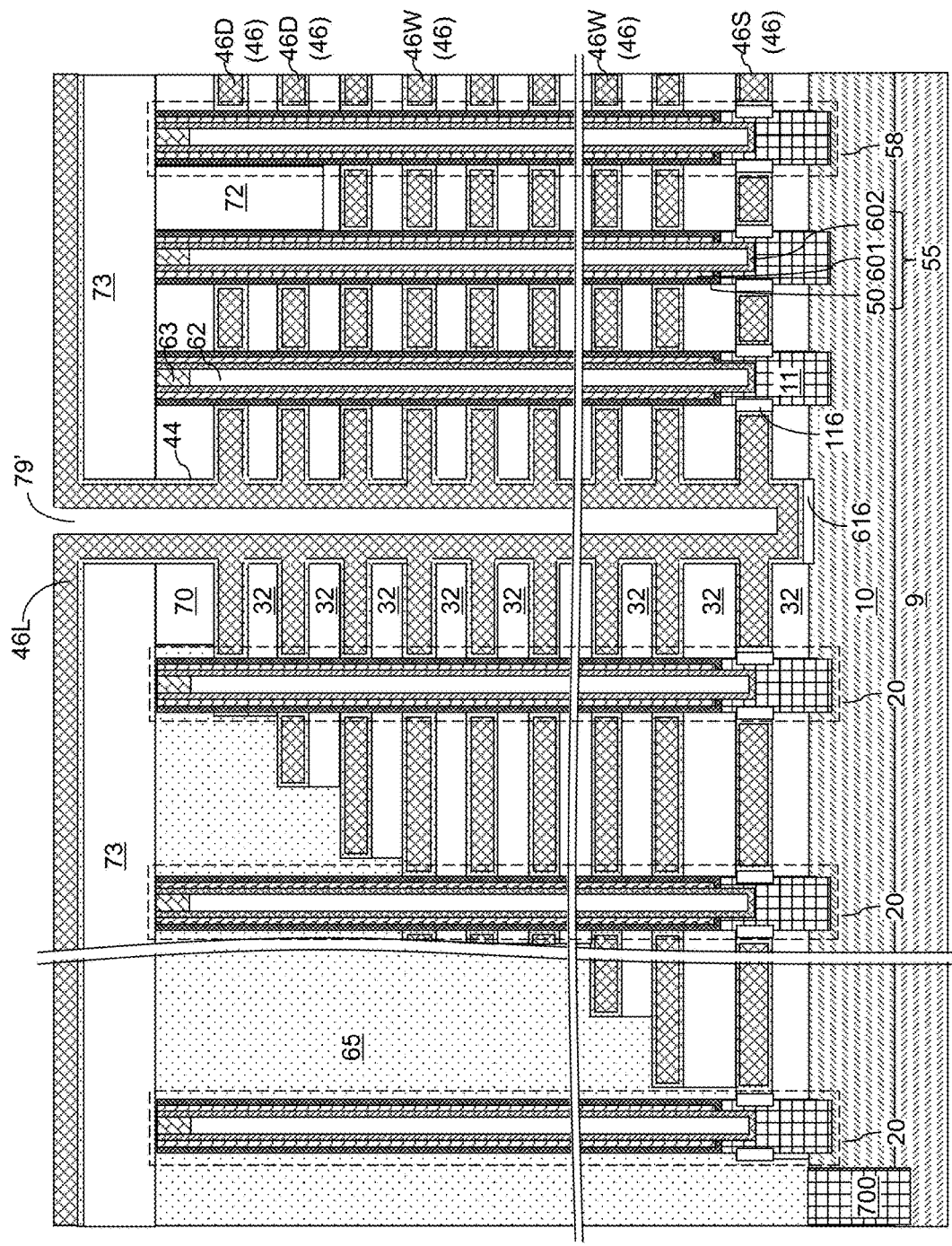
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The electrically conductive layers 46 include word line electrically conductive layers 46W that function as word lines for the memory stack structures 55 and drain select gate electrode layer sections 46D that are formed at the drain select levels above the word line levels. Each drain select gate electrode layer section 46D can be laterally spaced from a neighboring drain select gate electrode layer section 46D by a drain select level isolation structure 72 or a backside trench 79. One or more source select gate electrodes 46S can be formed at source select levels below the word line levels.

Figure 11:
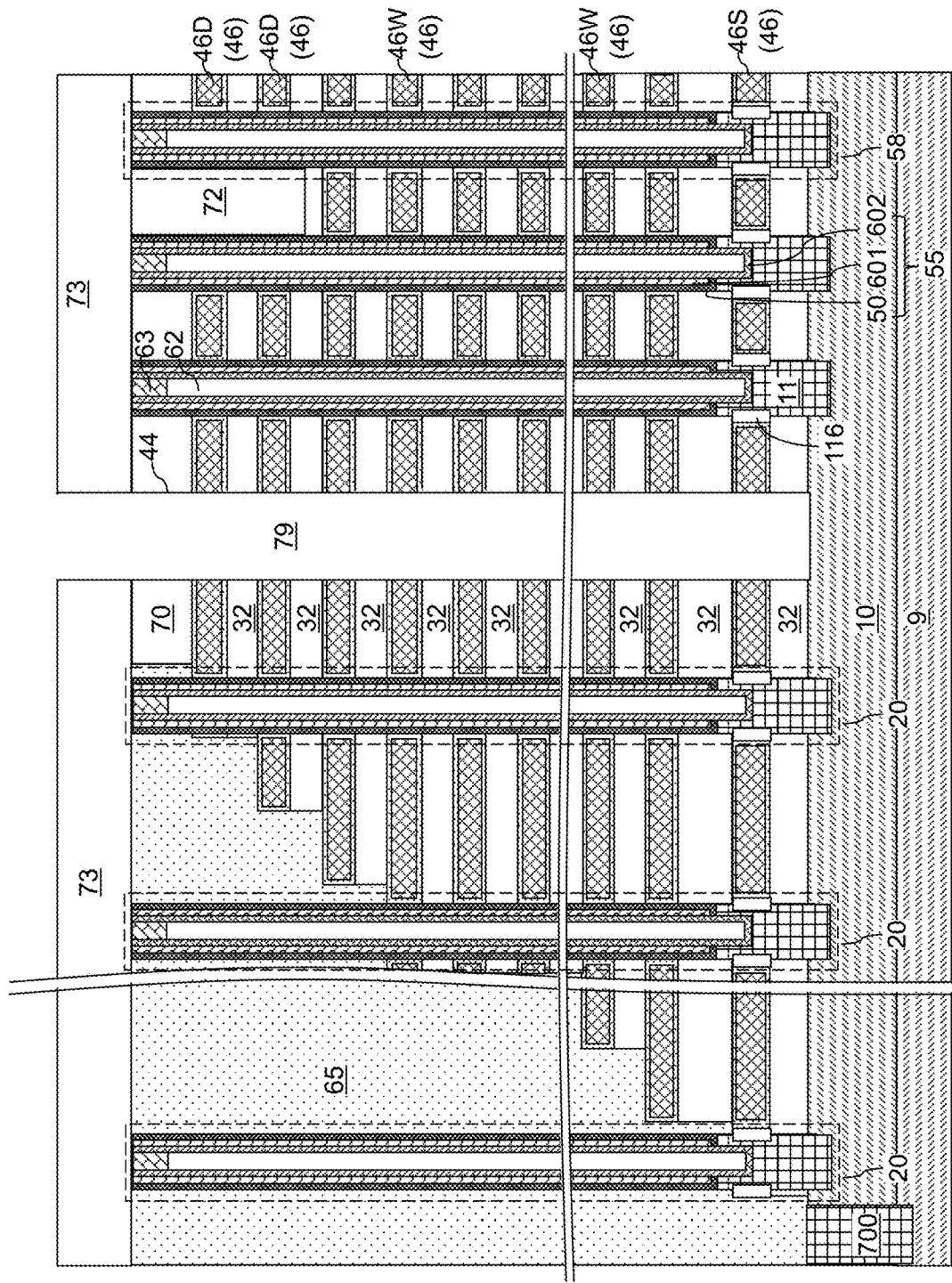
FIG. 11 is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

Figure 12A:
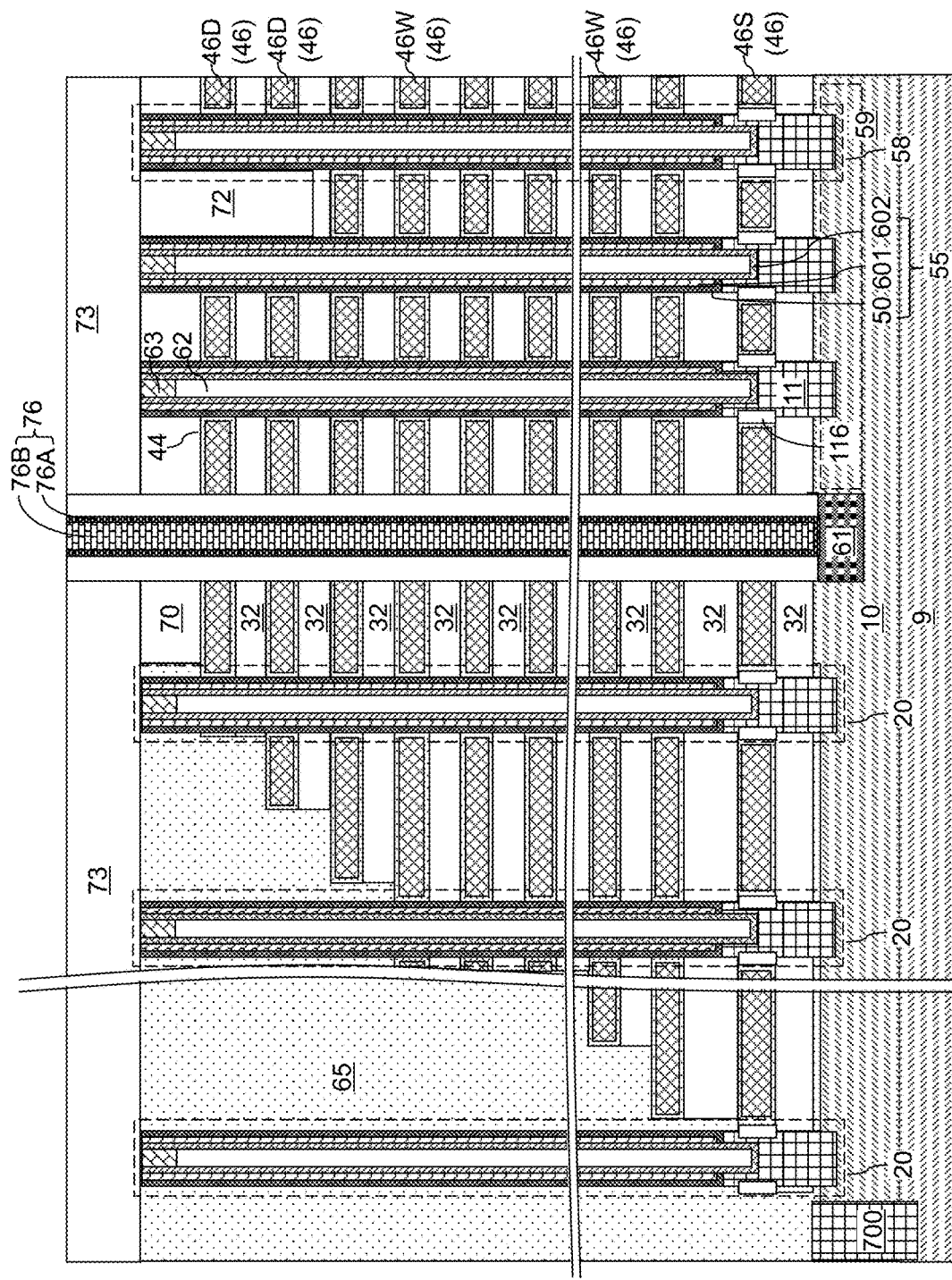
FIG. 12A is a schematic vertical cross-sectional view of the exemplary structure after formation of an insulating spacer and a backside contact structure within each backside trench according to an embodiment of the present disclosure.
Figure 12B:
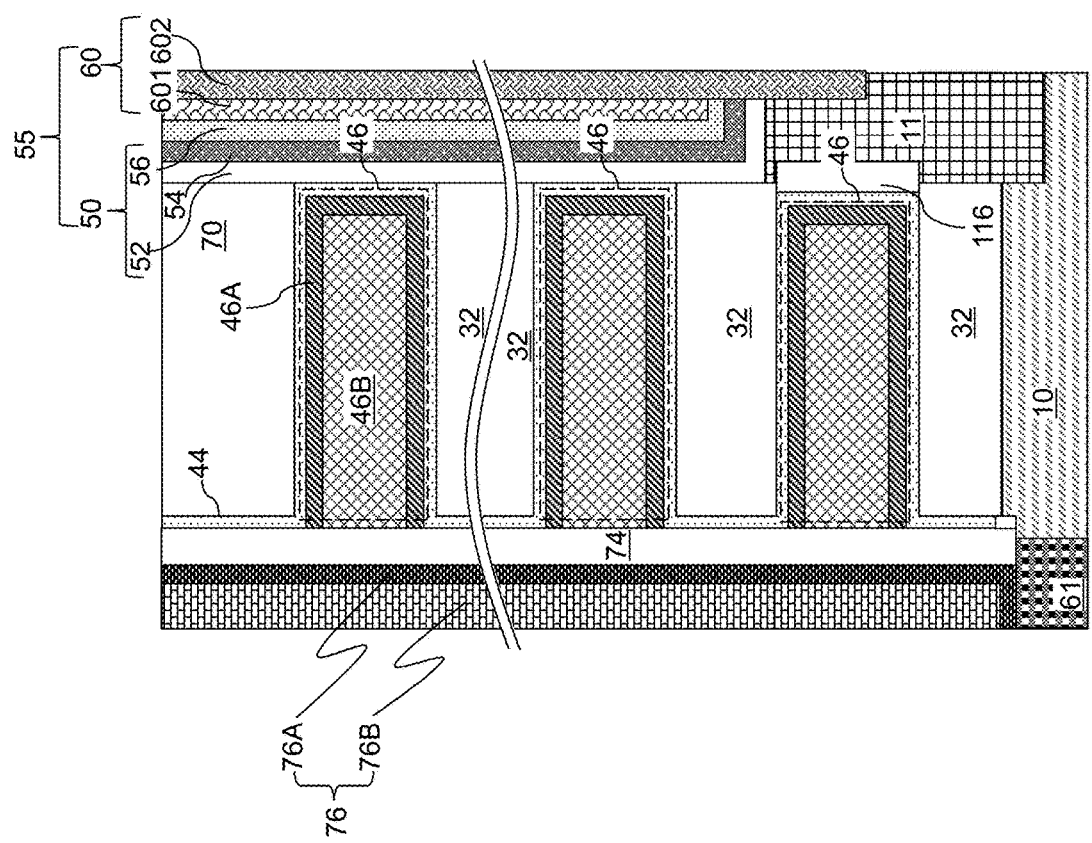
FIG. 12B is a magnified view of a region of the exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
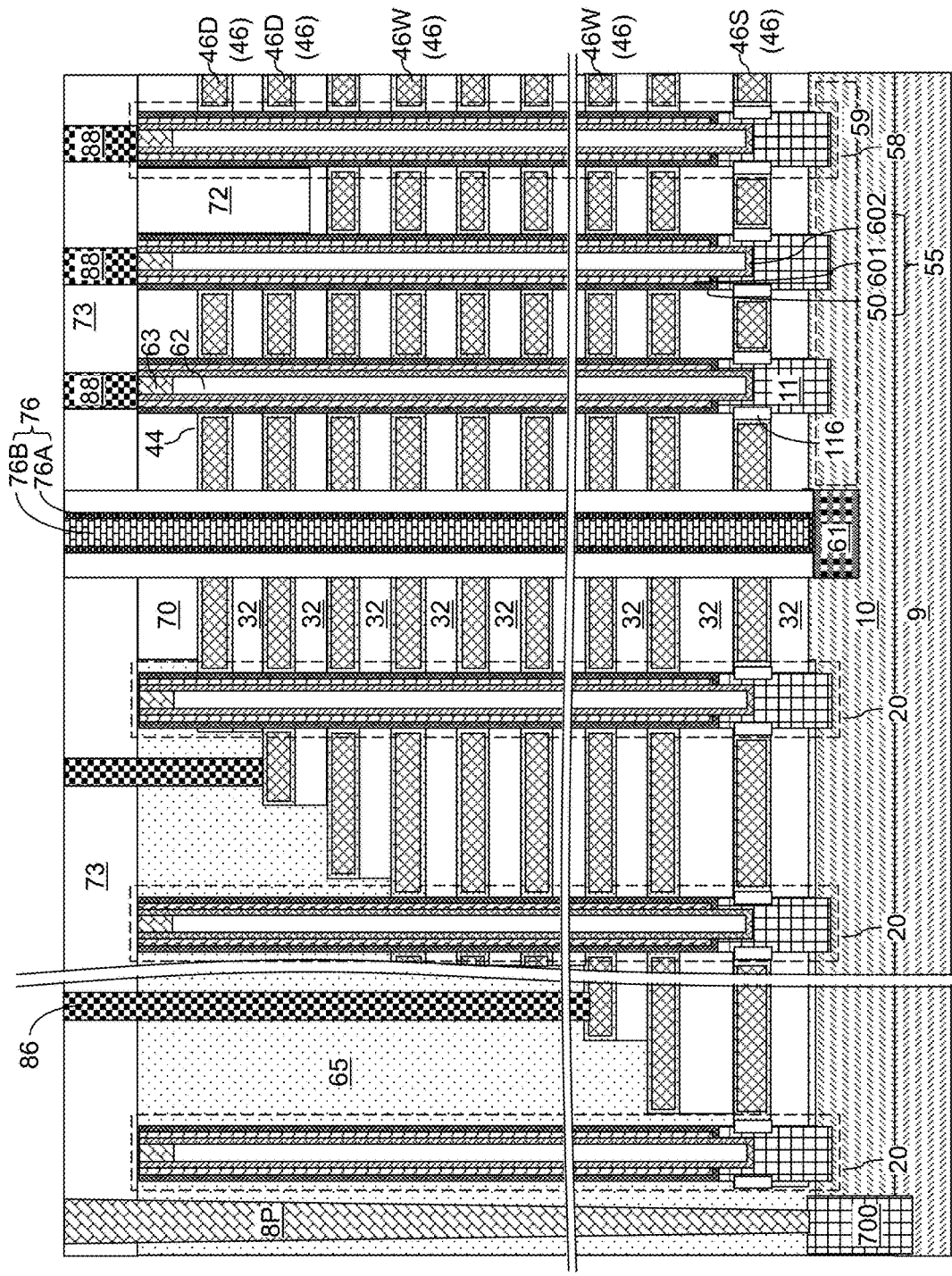
FIG. 13A is a schematic vertical cross-sectional view of the exemplary structure after formation of additional contact via structures according to an embodiment of the present disclosure.
Figure 13B:
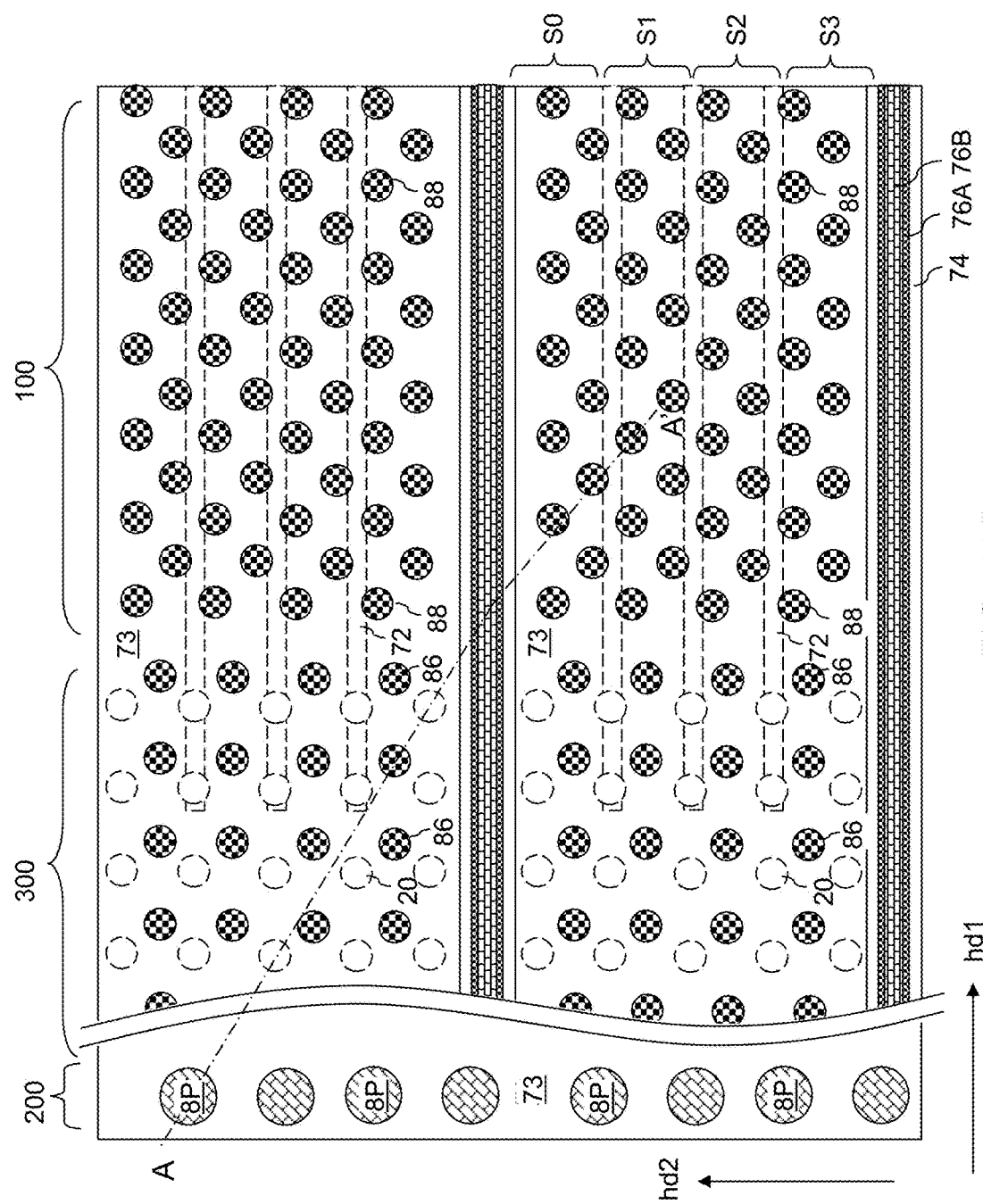
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

As discussed above, the electrically conductive layers 46 include word line electrically conductive layers 46W that function as word lines for the memory stack structures 55 and drain select gate electrode layer sections 46D that are formed at the drain select levels. Each drain select gate electrode layer section 46D can be laterally spaced from a neighboring drain select gate electrode layer section 46D by a drain select level isolation structure 72 or a backside trench 79, which can be filled within an insulating spacer 74 and a backside contact via structure 76. Each set of memory stack structures 55 laterally surrounded by a same drain select gate electrode layer section 46D is herein referred to as a group (S0, S1, S2, S3), or a group of memory stack structures 55. Multiple groups (S0, S1, S2, S3) of memory stack structures 55 can be located between a neighboring pair of backside trenches 79.

Figure 14A:
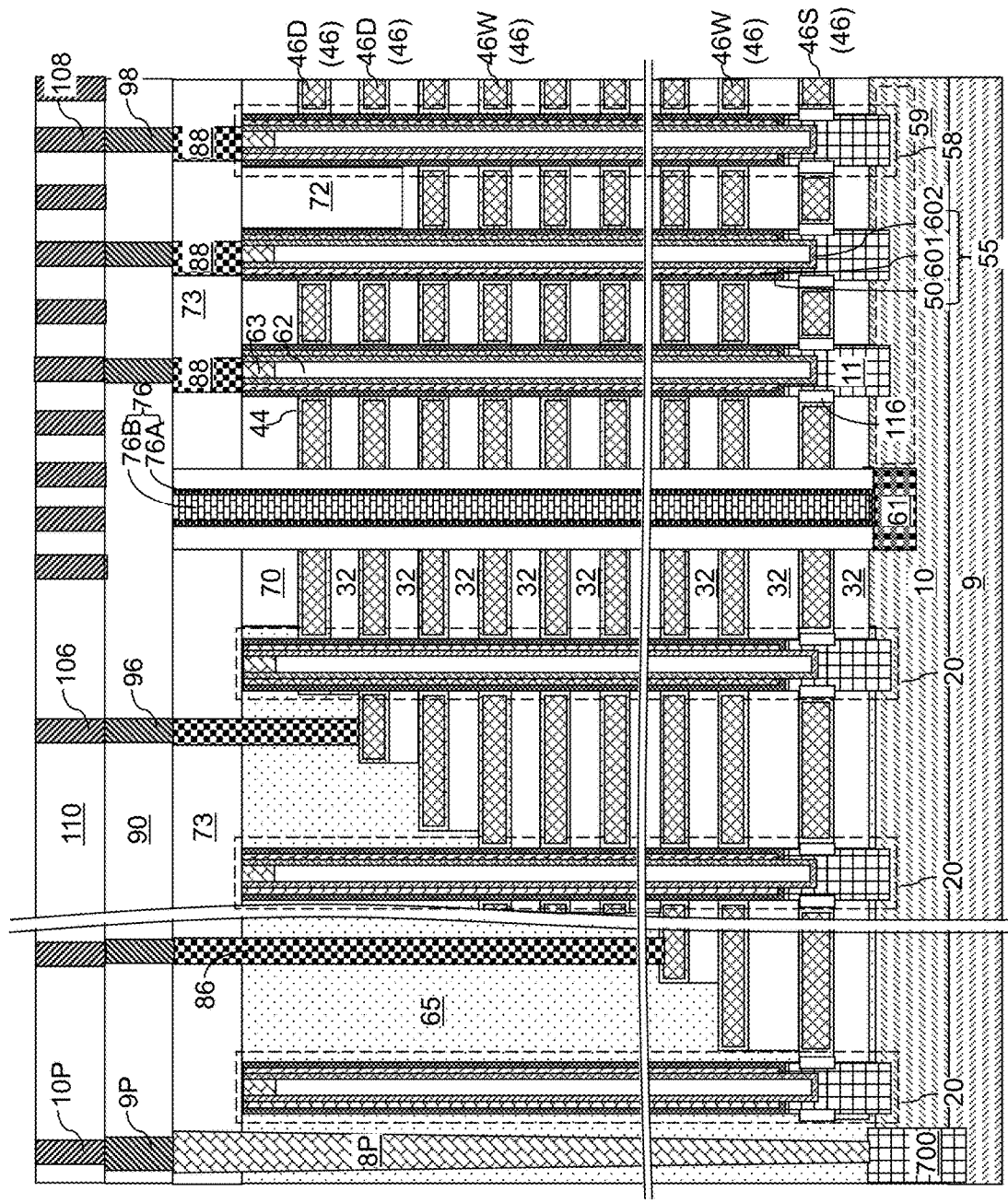
FIG. 14A is a schematic vertical cross-sectional view of the exemplary structure after formation of metal interconnect structures over the various contact via structures according to an embodiment of the present disclosure.
Figure 15:
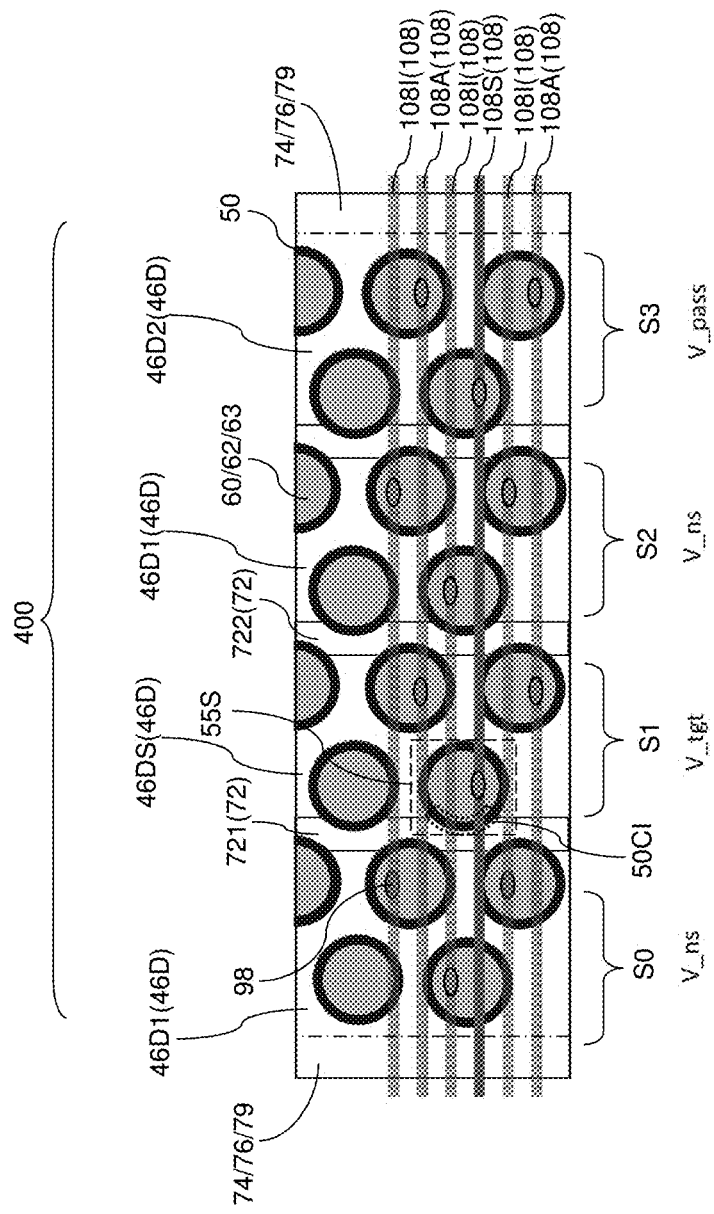
FIG. 15 is a schematic diagram for applying bias voltages to drain select gate electrodes during charge injection through field assisted programming according to an embodiment of the present disclosure.

Referring to FIGS. 14A, 14B and 15, additional interconnect level dielectric layers (90, 110) and additional metal interconnect structures (98, 96, 9P, 108, 106, 10P) can be formed over the contact level dielectric layer 73. The additional interconnect level dielectric layers (90, 110) can include a via level dielectric layer 90 formed on the contact level dielectric layer 73, and a line level dielectric layer 110 formed on the via level dielectric layer 90. The additional metal interconnect structures (98, 96, 9P, 108, 106, 10P) can include bit line connection via structures 98, word line connection via structures 96, peripheral connection via structures 9P, bit lines 108, word line connection metal lines 106, and peripheral connection metal lines 10P. The bit line connection via structures 98 can be formed on a respective one of the drain contact via structures 88 in the via level dielectric layer 90. The bit line connection via structures 98 can be elongated along the second horizontal direction hd2, and can be off-centered with respect to the geometrical center of an underlying drain contact via structure 88 to facilitate contact with only one of the overlying bit lines 108. Each word line connection via structure 96 can be formed on a respective one of the word line contact via structures 86 in the via level dielectric layer 90. Each peripheral contact via structure 9P can be formed on a respective one of the peripheral device contact via structures 8P in the via level dielectric layer 90. As shown in FIG. 14B, the bit lines 108 can be formed in the memory array region 100 along the second horizontal direction hd2 (i.e., the bit line direction).

According to an aspect of the present disclosure shown in FIG. 15, each bit line 108 can be electrically shorted to only one drain region 63 per each neighboring pair of groups (S0-S3) in a memory block 400 located between a neighboring pair of backside trenches 79. For example, if a first group S0, a second group S1, a third group S2, and a fourth group S4 are present in the same memory block 400 located between a neighboring pair of backside trenches 79, then each bit line 108 within a first subset of the bit lines 108 can be electrically shorted (i.e., electrically connected) to more than one drain region 63, such as two drain regions 63, in the same memory block 400. For example, the bit line 108 can be electrically shorted to a respective drain region 63 in the first group S0 and a respective drain region 63 in the third group S2, and each bit line 108 within a second subset of the bit lines 108 can be electrically shorted to a respective drain region 63 in the second group S1 and a respective drain region 63 in the fourth group S3. Thus, each bit line 108 is connected to drain regions 63 located within every other group in the same memory block 400 between a neighboring pair of backside trenches 79, and is electrically isolated from each intervening group. The same word line electrically conductive layer 46W is located in each group (S0, S1, S2, S3) in a respective word line level in the memory block 400 because the drain select level isolation structures 72 which separate the groups from each other in the memory block 400 do not extend through the word line electrically conductive layers 46W.

Each word line connection metal line 106 can contact a respective one of the word line connection via structures 96, and may be adjoined to a respective one of the peripheral connection metal lines 10P directly, or through intervening metal interconnect structures. In other words, the word line connection metal lines 106 and the peripheral connection metal lines 10P may be formed as integral structures or as separate structures. Each peripheral connection metal lines 10P can contact a respective one of the peripheral connection via structures 9P.

The configuration of the exemplary structure provides drain select gate electrode layer sections 46D that do not completely laterally surround each memory stack structure 55. At least one row of memory stack structures 55 within each group (S0-S3) directly contacts a drain select level isolation structure 72, and prevents the corresponding drain select gate electrode layer sections 46D from completely laterally surrounding the memory stack structures 55 within the at least one row of memory stack structures 55. Specifically, each group (S1, S2) laterally abutted by a pair of drain select level isolation structures 72 includes two rows of memory stack structures 55 that are not laterally encircled by a respective drain select gate electrode layer section 46D, and each group (S0, S3) laterally abutted by a drain select level isolation structure 72 and a backside trench 79 include one row of memory stack structures 55 that are not laterally encircled by a respective drain select gate electrode layer section 46D.

Each memory stack structure 55 that is laterally encircled by a drain select gate electrode layer section 46D can be programmed and read by applying appropriate bias voltages to the drain select gate electrode layer section 46D, to the word line electrically conductive layers 46W, a source region 61 connected to the vertical semiconductor channel 60 of the memory stack structures 55, and a bit line 108 that is connected to the drain region 63 contacting a top end of the vertical semiconductor channel. During such a programming operation or such as reading operation, control of the electrical charges in the portions of the memory film 50 within the memory stack structure 55 located at the levels of the drain select gate electrode layer sections 46D is provided by the respective drain select gate electrode layer sections 46D, which encircles the memory stack structure 55. Thus, leakage current is minimized by the encircling configuration of the drain select gate electrode layer sections 46D.

However, for memory stack structures 55 that are not completely encircled by the drain select gate electrode layer sections 46D, leakage current can be significant, and control of electrical charges in the portions of the memory film 50 within the memory stack structure 55 located at the levels of the drain select gate electrode layer sections 46D can be difficult during a programming operation or a reading operation. In other words, each memory stack structure 55 in direct contact with a drain select level isolation structure 72 suffers from degraded leakage characteristics and reduced control of electrical charges in the portions of the memory film 50 that directly contact the drain select level isolation structures 72. This is because the drain select gate electrode layer sections 46D can control the electrostatic potential of the portions of the memory film 50 that directly contact the drain select gate electrode layer sections 46D, but does not directly contact the electrostatic potential of the portions of the memory film 50 that directly contact the drain select level isolation structures 72.

In case the trapped charges in the memory films 50 are electrons, the density of trapped electrons in the region of each memory film 50 that contacts a drain select level isolation structure 72 is lower than the density of trapped electrons in the region of the each memory film 50 that contacts a drain select gate electrode layer section 46D. Thus, effective threshold voltage for the region of each memory film 50 that contacts a drain select level isolation structure 72 is lower than the effective threshold voltage for the region of each memory film 50 that contacts a respective drain select gate electrode layer section 46D. This mechanism induces higher leakage current through a portion of a vertical semiconductor channel 60 that is adjacent to a drain select level isolation structures 72. Further, during a read operation, read bias voltages applied to neighboring groups can induce high leakage current through a portion of a vertical semiconductor channel 60 that is adjacent to a drain select level isolation structures 72.

According to an aspect of the present disclosure, methods of operating the exemplary structure with steps are provided for suppressing such leakage current through a portion of a vertical semiconductor channel 60 that is adjacent to a drain select level isolation structures 72. The methods of the present disclosure can be employed to minimize the leakage current through the portions of the vertical semiconductor channels 60 that are adjacent to portions of the memory films 50 that contact the drain select level isolation structures 72. Further, the methods of the present disclosure can be employed to provide enhanced control of electrical current through the vertical semiconductor channels 60 located within memory stack structures 55 that are in direct contact with the drain select level isolation structures 72.

Referring to FIG. 15, a schematic diagram is illustrated for applying bias voltages to drain select gate electrode layer sections 46D during charge injection through field assisted programming according to an embodiment of the present disclosure. The exemplary structure described above can be employed to apply this method. Specifically, a three-dimensional memory device can be employed, which includes an alternating stack of insulating layers 32 and electrically conductive layers 46 located over a substrate (9, 10). Memory stack structures 55 extend vertically through the alternating stack (32, 46). Each of the memory stack structures 55 includes a memory film 50 that surrounds a vertical semiconductor channel 60. The memory stack structures 55 are arranged in multiple groups (S0-S3) that are laterally spaced apart by drain select level isolation structures 72 at a drain select level, which can include a topmost level of the electrically conductive layers 46, but not the word line electrically conductive layer 46W levels. At least one row of memory stack structures 55 directly contacts a respective one of the drain select level isolation structures 72 in each of the multiple groups (S0-S3).

A memory stack structure 55S can be selected for operation. For example, the selected memory stack structure 55S is located in group 51 between neighboring groups S0 and S2 in the memory block 400. The selected memory stack structure 55S contacts a first one 721 of the drain select level isolation structures 72 and is partially laterally surrounded by a selected drain select gate electrode layer section 46DS at the drain select level. In one embodiment, each drain select gate electrode layer section 46DS that partially surrounds the selected memory stack structure 55S can be selected. Subsequently, electrical charges can be injected within portions of a memory film 50 in the selected memory stack structure 55 that are located at each drain select level. Injection of the electrical charges can be effected by applying a target string bias voltage V_tgt to the selected drain select gate electrode layer section 46DS in the selected group S1, applying a neighboring string bias voltage V_ns to a first unselected drain select gate electrode layer sections 46D1 located in neighboring groups S0 and S2 and that contacts the first one 72I of the drain select level isolation structures 72, and applying a pass bias voltage V_pass to a second unselected drain select gate electrode layer section 46D2 located in group S3 and that is laterally spaced from the selected drain select gate electrode layer section 46DS by at least one group (which can be a group laterally surrounded by another first unselected drain select gate electrode layer section 46D1). A programming drain bias voltage can be applied to a drain 63 which contacts the vertical semiconductor channel 60 within the selected memory stack structure 55S. The neighboring string bias voltage V_ns is different from the pass bias voltage V_pass. In some embodiments, the neighboring string bias voltage V_ns has a greater magnitude than the target string bias voltage V_tgt. In case the selected group 51 has two neighboring groups S0 and S2 that are laterally separated by a respective drain select level isolation structure 72, the neighboring string bias voltage V_ns can be applied to each first unselected drain select gate electrode layer section 46D1 that are neighboring drain select gate electrodes of the selected drain select gate electrode layer section 46DS.

The various word line electrically conductive layers 46W can be biased at a word line pass bias voltage, which turns on the vertical semiconductor channels 60 within all memory stack structures 55 between a pair of backside trenches 79 at each word line level. The programming drain bias voltage is applied to a selected bit line 108S, which is electrically shorted to the drain region 63 that contacts the vertical semiconductor channel 60 within the selected memory stack structure 55S. As discussed above, each bit line 108 is electrically connected to one drain region 63 per each neighboring pair of groups of memory stack structures 55. Thus, drain regions 63 within the first unselected neighboring groups (S0, S2) are not electrically biased with the programming drain bias voltage. Only a single drain region 63 within every other alternating group (such as the second unselected spaced group S3 for which the pass bias voltage V_pass is applied to the respective drain select gate electrode layer section 46D2) is electrically biased with the programming drain bias voltage. However, the pass bias voltage V_pass is applied to the respective drain select gate electrode layer section 46D2 turns off the vertical semiconductor channel 60 that adjoins the drain region 63 to which the programming drain bias voltage is applied. Thus, the combination of the target string bias voltage V_tgt applied to the selected drain select gate electrode layer section 46DS in the selected group 51, the pass bias voltage V_pass applied to each second unselected drain select gate electrode layer section 46D2, and the programming drain bias voltage is applied to the selected bit line 108S can activate only the selected memory stack structure 55S without activating any other memory stack structure 55 in the selected group 51.

Generally speaking, the target string bias voltage V_tgt, the neighboring string bias voltage V_ns, the pass bias voltage V_pass, and the programming drain bias voltage can be selected to enable charge injection to a region of the memory film 50 of the selected memory stack structure 55S that contacts the drain select level isolation structure 72. The region of the memory film 50 of the selected memory stack structure 55S that contacts the drain select level isolation structure 72, to which electrons can be injected, is herein referred to as a fringe field assisted charge injection region 50CI.

The neighboring string bias voltage V_ns is different (e.g., greater) than the pass bias voltage V_pass. In one embodiment, the neighboring string bias voltage V_ns can have a greater magnitude than the target string bias voltage V_tgt to provide sufficient electrical field for inducing charge injection into the fringe field assisted charge injection region 50CI. According to an aspect of the present disclosure, a higher voltage is employed for the first unselected drain select gate electrode layer section 46D1 than for the selected drain select gate electrode layer section 46DS in order to provide a sufficient electrical field to enable charge tunneling into the fringe field assisted charge injection region 50CI. This mechanism is herein referred to as fringe field assisted (FFA) programming, in which the neighboring string bias voltage V_ns applied to the first unselected drain select gate electrode layer section 46D1 induces sufficient fringe electrical field across the drain select level isolation structure 72 and the fringe field assisted charge injection region 50CI to induce sufficient charge tunneling into the fringe field assisted charge injection region 50CI. In one embodiment, the absolute value of neighboring string bias voltage V_ns can be in a range from 101% to 150% of the absolute value of neighboring of the target string bias voltage V_tgt, and the absolute value of neighboring pass bias voltage V_pass can be in a range from 20% to 50% of the absolute value of neighboring the target string bias voltage.

In an illustrative example in which electron tunneling is employed to store electrical charges in the memory films 50, the target string bias voltage V_tgt can be in a range from 9 V to 30 V, the neighboring string bias voltage V_ns can be in a range from 9.5 V to 45 V, the pass bias voltage can be in a range from 3 V to 22.5 V, and the programming drain bias voltage is in a range from −1 V to 2 V, such as 0 V.

Generally, the three-dimensional memory device can include dielectric material portions that are formed in the backside trenches 79. Such dielectric material portions may be the insulating spacers 74 described above, or alternatively, dielectric wall structures that fill the entire volume of each backside trench 79 in case electrical contact to the horizontal semiconductor channels 59 are provided by contact via structures formed outside of the backside trenches 79. For each alternating stack (32, 46) formed between a neighboring pair of backside trenches 79, a pair of dielectric material portions (such as a pair of insulating spacers 74) can be provided that laterally extend along a first horizontal direction hd1 and located on either side of the alternating stack (32, 46). The electrically conductive layers 46 can include word line electrically conductive layers 46W that function as word lines for the memory stack structures 55 and laterally extend between the pair of dielectric material portions 74. The drain select level isolation structures 72 are located between the pair of dielectric material portions 74 and laterally extend along the first horizontal direction hd1 and laterally separate only the drain select gate electrode layer sections 46D, which are a subset of the electrically conductive layers 46 overlying the word line electrically conductive layers 46.

Each of the drain select level isolation structures 72 can generally extend along the first horizontal direction hd1 (e.g., word line direction), and can include a pair of lengthwise sidewalls that extend along the first horizontal direction hd1. Each of the pair of lengthwise sidewalls can include an alternating sequence of planar sidewalls (i.e., sidewalls located within a two-dimensional Euclidean plane) and concave vertical sidewalls. Each of the concave vertical sidewalls contacts a respective one of the memory stack structures 55.

The use of fringe field assisted programming allows significant increase in the charge tunneling rate into the fringe field assisted charge injection region 50CI relative to the charge tunneling rate into the portions of the memory film 50 that directly contact selected drain select gate electrode layer section 46DS. The higher the neighboring string bias voltage V_ns relative to the target string bias voltage V_tgt, the greater the ratio of the charge tunneling rate into the fringe field assisted charge injection region 50CI to the charge tunneling rate into the portions of the memory film 50 that directly contact selected drain select gate electrode layer section 46DS. In some embodiments, the ratio of the charge tunneling rate into the fringe field assisted charge injection region 50CI to the charge tunneling rate into the portions of the memory film 50 that directly contact selected drain select gate electrode layer section 46DS may be 1.0, or may be greater than 1.0.

In one embodiment, electrical charge tunneling per unit area into a portion of a memory film 50 within the selected memory stack structure 55S that contacts the first one 721 of the drain select level isolation structures 72 can occur at a same rate as, or at a higher rate than, electrical charge tunneling per unit area into another portion of the memory film 50 within the selected memory stack structure 55S that contacts the selected drain select gate electrode layer section 46DS during charge injection within the selected memory stack structure 55S.

The three-dimensional memory device includes drain regions 63 contacting a top end of a respective one of the vertical semiconductor channels 60, and bit lines 108 that extend in the bit line direction hd2 (e.g., perpendicular to the word line direction hd1) and are electrically shorted a respective subset of the drain regions 63 such that each bit line 108 is electrically shorted to only one drain region 63 per each neighboring pair of groups of memory stack structures 55.

In order to ensure that charge injection does not occur in the memory films 50 located at the drain select levels of the first unselected neighboring groups (i.e., in the memory films 50 at least partially surrounded by the first unselected drain select gate electrode layer sections 46D1), a neighboring string inhibit voltage can be applied to each bit line 108 connected to vertical semiconductor channels 60 that pass through the first unselected drain select gate electrode layer sections 46D1 during charge injection into the memory film 50 within the selected memory stack structure 55S. The neighboring string inhibit voltage can be between the programming drain bias voltage and the neighboring string bias voltage V_ns, and may be between the programming drain bias voltage and the target string bias voltage V_tgt. In one embodiment, the neighboring string inhibit voltage may be not less than the pass bias voltage V_pass and the target string bias voltage V_tgt. In an illustrative example, the neighboring string inhibit voltage may be in a range from 6 V to 18 V, such as from 8 V to 14 V. In one embodiment, the voltage difference between the neighboring string inhibit voltage and the pass bias voltage is less than a critical voltage that induces charge tunneling through memory films 50 within the memory stack structures 55.

Each bit line 108 to which the neighboring string inhibit voltage is applied is herein referred to as an inhibited bit line 108I. In one embodiment, each bit line 108 that is connected to the drain regions 63 connected to the neighboring group(s), i.e., to any of the memory stack structures 55 at least partly laterally surrounded by the first unselected drain select gate electrode(s) 46D1, can be biased with the neighboring string inhibit voltage to prevent any charge injection into the memory films 50 within the neighboring group(s).

Unless the selected drain select gate electrode layer section 46DS borders a backside trench 79, the selected drain select gate electrode layer section 46DS can contact a second one 722 of the drain select level isolation structures 72. In this case, an additional first unselected drain select gate electrode layer section 46D1 contacts the second one 722 of the drain select level isolation structures 72. The neighboring string inhibit voltage can be applied to each bit line 108 connected to vertical semiconductor channels 60 that pass through the additional first unselected drain select gate electrode layer section 46D1 during charge injection into the memory film 50 within the selected memory stack structure 55S.

The bit lines 108 that are not the selected bit line 108S and connected to a drain region 63 on memory stack structures 55 within the selected group are herein referred to as active bit lines 108A. In one embodiment, charge injection into portions of the memory films 50 located within the selected group can be performed for all memory films 50 within the selected group. In this case, the programming drain bias voltage can be applied to each active bit line 108A. For example, the programming drain bias voltage can be in a range from −1 V to 2 V, such as 0 V. Generally, the programming drain bias voltage can be applied to at least another bit line connected to vertical semiconductor channels of at least another memory stack structure 55 that pass through the selected drain select gate electrode layer section 46DS. In one embodiment, all memory stack structures 55 passing through the selected drain select gate electrode layer section 46DS can be selected for simultaneous charge injection. This operational mode is the same as selecting all memory stack structures 50 within the selected group for charge injection into the memory films 50 therein.

In another embodiment, charge injection can be performed only for the memory film 50 within the selected memory stack structure 55S, i.e., only into the memory film 50 of a single selected memory stack structure 55S in the selected group S1. In this case, a selected string inhibit voltage can be applied to each active bit line 108A. The selected string inhibit voltage prevents charge injection into any memory film 50 within the selected group S1 other than the memory film 50 within the selected memory stack structure 55S. The selected string inhibit voltage is greater than the programming drain bias voltage, and is less than the neighboring string inhibit voltage. For example, the selected string inhibit voltage can be in a range from 1 V to 8 V, such as from 1 V to 4 V. The selected string inhibit voltage can be applied to each bit line connected to vertical semiconductor channels 60 of unselected memory stack structures 55 that pass through the selected drain select gate electrode layer section 46DS in the selected group 51. The selected string inhibit voltage prevents charge tunneling within the unselected memory stack structures 55 in the selected group S1 because the selected string inhibit voltage is greater than the programming drain bias voltage.

Generally, an arbitrary number of memory stack structures 55 that pass through the selected drain select gate electrode layer section 46DS in the selected group S1 can be selected for charge injection by applying the programming drain bias voltage to each bit line that is connected to the vertical semiconductor channels 60 within the selected memory stack structures 55, while the complementary set of memory stack structures 55 that pass through the selected drain select gate electrode layer section 46DS can be unselected by applying the selected string inhibit voltage to each bit line that is connected to the vertical semiconductor channels 60 within the unselected memory stack structures 55. In other words, the voltage to each active bit line 108A can be selected between the programming drain bias voltage and the selected string inhibit voltage depending on whether the memory stack structure 55 to which each active bit line 108A is connected is selected for charge injection or not.

The fringe field assisted programming of the portions of the memory films 50 located at the levels of the drain select gate electrode layer sections 46D prepares the three-dimensional memory device for low leakage operation during subsequent programming or reading of the memory elements in the memory stack structures 55. The additional trapped electrical charges (e.g., electrons) that are trapped in the fringe field assisted charge injection regions 50CI suppresses leakage current through portions of the vertical semiconductor channels 60 that contact the fringe field assisted charge injection regions 50CI.

Figure 16A:
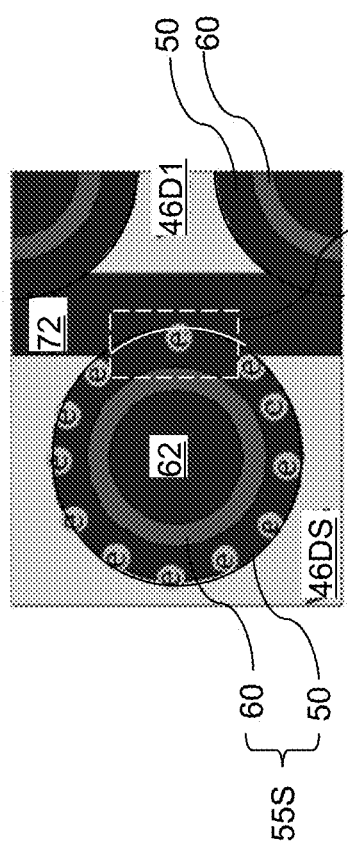
FIGS. 16A and 16B are respective schematic horizontal cross-sectional and cut-away perspective views of a selected memory stack structure prior to charge injection according to an embodiment of the present disclosure.
Figure 16B:
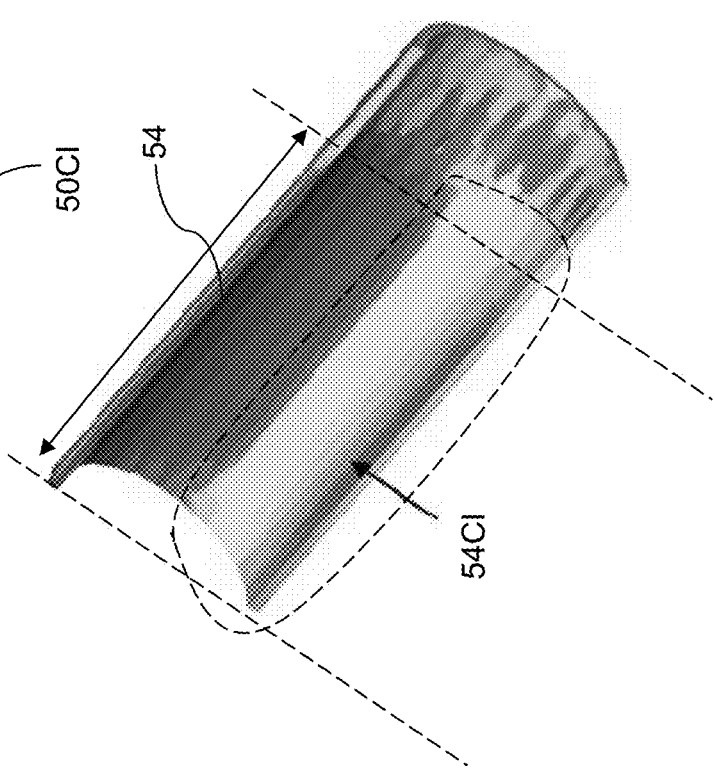

Referring to FIGS. 16A and 16B, the mechanism for enhancing charge trapping in a fringe field assisted charge injection region 50CI is illustrated. If the neighboring string bias voltage V_ns is set to 0 V while applying the target string bias voltage V_tgt to the selected drain select gate electrode layer section 46DS, electron tunneling occurs only into portions of the memory film 50 of the selected memory stack structure 55S that contact the selected drain select gate electrode layer section 46DS because the electrical field through the fringe field assisted charge injection region 50C1 is insignificant. The lack of electrical charges in the portion 54C1 of the charge storage layer 54 located in region 50C1 of the memory film 50, and that is adjacent to the drain select level isolation structure 72 is illustrated in the cut-out perspective view of the charge storage layer 54 at the level of the drain select gate electrode layer sections 46D. The fringe field assisted programming method according to an embodiment of the present disclosure provides a non-zero voltage as the neighboring string bias voltage V_ns to the first unselected drain select gate electrode layer section 46D1, which can be greater than the target string bias voltage V_tgt. Such a neighboring string bias voltage V_ns increases charge tunneling into, and charge trapping within, the portion 54C1 of the charge storage layer 54 located adjacent to the drain select level isolation structure 72.

Generally, charge trapping can be induced within the regions 50C1 of the memory film 50 in the selected memory stack structure 55S that are located at the drain select level while word line electrically conductive layers 46W among the electrically conductive layers 46 are electrically biased at a voltage (which is herein referred to as a word line pass voltage) that does not induce charge tunneling through the memory film 50 in the selected memory stack structure 55S. Programming operations and/or reading operations can be performed concurrently with and/or subsequently to providing the charge into the portions of the memory films 50 located at the drain select levels. For example, electrical charges can be stored in memory elements (i.e., portions of the charge storage layers 54 located at the levels of the word line electrically conductive layers 46W) within the memory film 50 in the selected memory stack structure 55S. Alternatively or additionally, electrical charges in the memory elements within the memory film 50 in the selected memory stack structure 55S can be read in a subsequent reading operation.

In one embodiment, memory elements within the memory film 50 within the selected memory stack structure 55S can be programmed by applying word line programming bias voltages to each word line electrically conductive layers 46W among the electrically conductive layers 46 that laterally surround the selected memory stack structure 55S. Electrical charge tunneling occurs at each word line level at which a respective word line programming bias voltage differs from the programming drain bias voltage by more than a critical voltage that induces charge tunneling. Memory elements within the memory film 50 within the selected memory stack structure 55S can be sequentially read by applying a selected word line read bias voltage to a sequentially selected one of the word line electrically conductive layers 46W among the electrically conductive layers 46 while applying a pass read bias voltage to unselected word line electrically conductive layers. Charge states of the memory elements within the memory film 50 within the selected memory stack structure 55S can be sequentially read.

Generally, the three-dimensional memory device can include a monolithic three-dimensional NAND memory device. The electrically conductive layers 46 include, or are electrically connected to, a respective word line 46W of the monolithic three-dimensional NAND memory device. The substrate (9, 10) can include a silicon substrate. The monolithic three-dimensional NAND memory device can include an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon. The electrically conductive layers 46 comprise a plurality of control gate electrodes (as embodied as the word line electrically conductive layers 46W) having a strip shape extending substantially parallel to the top surface of the substrate (9, 10). The plurality of control gate electrodes can include at least a first control gate electrode located in the first device level and a second control gate electrode located in the second device level. The array of monolithic three-dimensional NAND strings can include a plurality of semiconductor channels (59, 60), wherein at least one end portion of each of the plurality of semiconductor channels (59, 60) extends substantially perpendicular to a top surface of the substrate (9, 10), and a plurality of charge storage elements (which can be embodied, for example, as portions of the charge storage layer 54 located at each level of the word line electrically conductive layers 46W), each charge storage element located adjacent to a respective one of the plurality of semiconductor channels (59, 60).

The charge trapping in the un-gated portions of the memory films 50, i.e., in the portions of the memory film 50 that contacts a respective one of the drain select level isolation structures 72, induces an increase in the local threshold voltage for adjoining portions of the vertical semiconductor channels 60. In some embodiment, charge injection into the fringe field assisted charge injection region 50CI can be performed employing multiple programming pulses. In other words, charge injection into the fringe field assisted charge injection region 50CI can be performed multiple times to increase the amount of trapped electrical charges.

Figure 17:
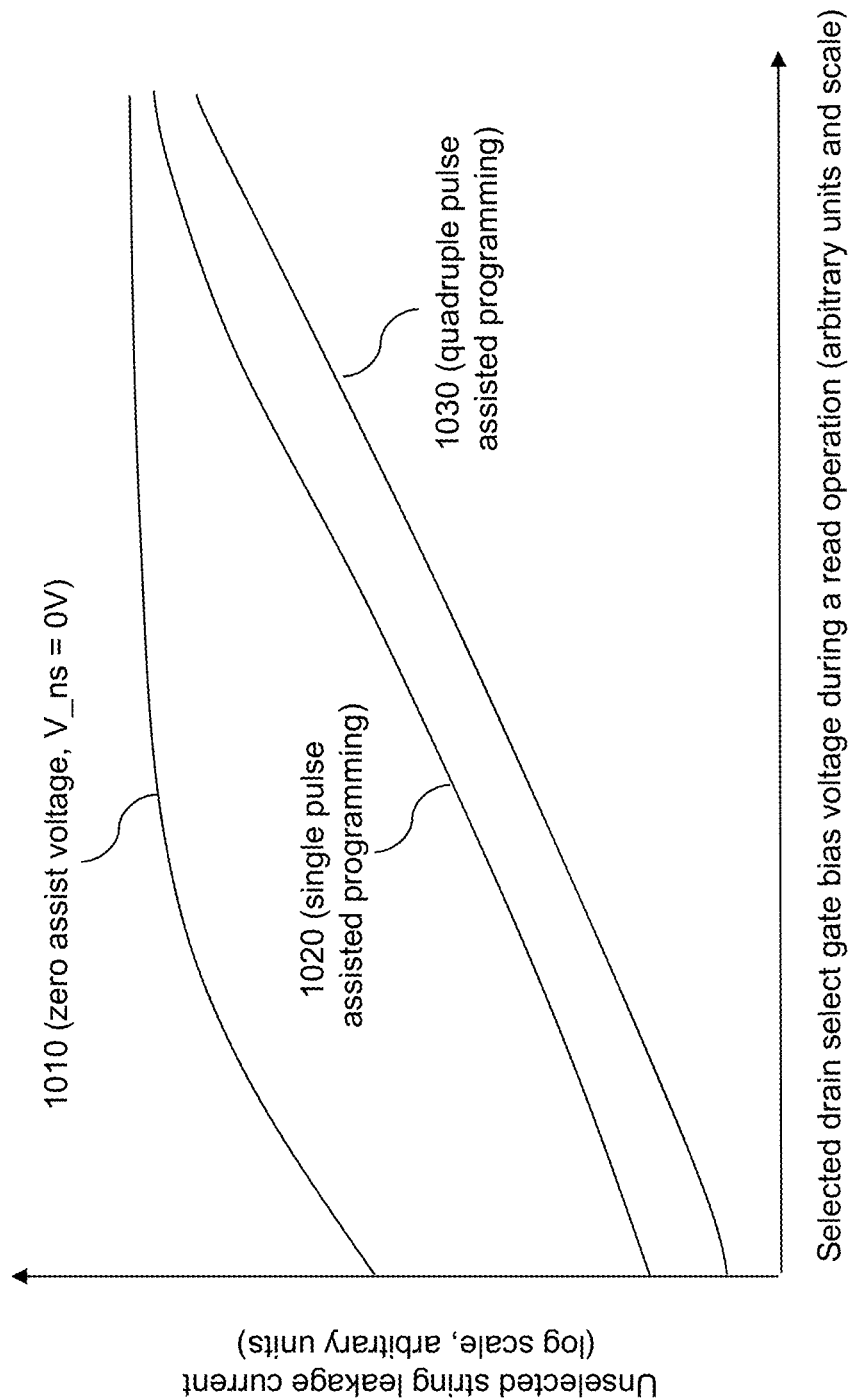
FIG. 17 is a graph illustrating reduction of leakage current through field assisted programming according to an embodiment of the present disclosure.

Referring to FIG. 17, the effect of charge trapping on the leakage current through an unselected group of memory stack structures 55 is illustrated. Curve 1010 illustrates the leakage current through an unselected group of memory stack structures 55 that does not employ fringe field assisted programming method of the embodiments of the present disclosure. In other words, curve 1010 illustrates a case in which 0 V is applied to the first neighboring drain select gate electrode layer sections 46D1. In this case, the leakage current as a function of the drain select gate electrode bias voltage applied to a neighboring group of memory stack structures 55 increases significantly even at a relatively low voltage (which may be, for example, in the range of 3 V).

Curves 1020 and 1030 illustrate the leakage current through an unselected group of memory stack structures 55 that is previously subjected to a fringe field assisted programming method of the embodiments of the present disclosure. Specifically, the target string bias voltage V_tgt is applied to the drain select gate electrode layer section 46DS in the selected memory stack structure and a single pulse of a neighboring string bias voltage V_ns is applied to each first neighboring drain select gate electrode layer sections 46D1 of the unselected groups for curve 1020 and four pulses of a neighboring string bias voltage V_ns are applied to each first neighboring drain select gate electrode layer sections 46D1 of the unselected groups for curve 1030. As can be seen in FIG. 17, the leakage current is lower for curves 1020 and 1030 than for curve 1010.

The charge injection into the memory films 50 has the net effect of raising the local threshold voltage for the portions of the vertical semiconductor channels 60 that are adjacent to the drain select level isolation structures 72, and the leakage current due to the incomplete surrounding of the memory stack structures 55 by the drain select gate electrode layer sections 46D can be compensated by charge injection into the fringe field assisted charge injection regions 50CI.

In one embodiment, the neighboring string bias voltage V_ns can be applied as multiple pulses to the first unselected drain select gate electrode layer section 46D1 that contacts the first one 721 of the drain select level isolation structures 72 while inducing charge trapping within the portions of the memory film 50 in the selected memory stack structure 55S that are located at the drain select level. In one embodiment, the target string bias voltage V_tgt can be applied as multiple pulses to the selected drain select gate electrode layer section 46DS, and the neighboring string bias voltage V_ns can be applied as multiple pulses to the first unselected drain select gate electrode layer section 46D1 in synchronization with the multiple pulses of the target string bias voltage V_tgt.

In some embodiments of the present disclosure, the methods of the present disclosure can be implemented by a circuitry configured to generate the various voltages described above. As used herein, an element is "configured" to perform a function if the element has all necessary structural components and accompanying software to enable execution of the function.

Figure 18:
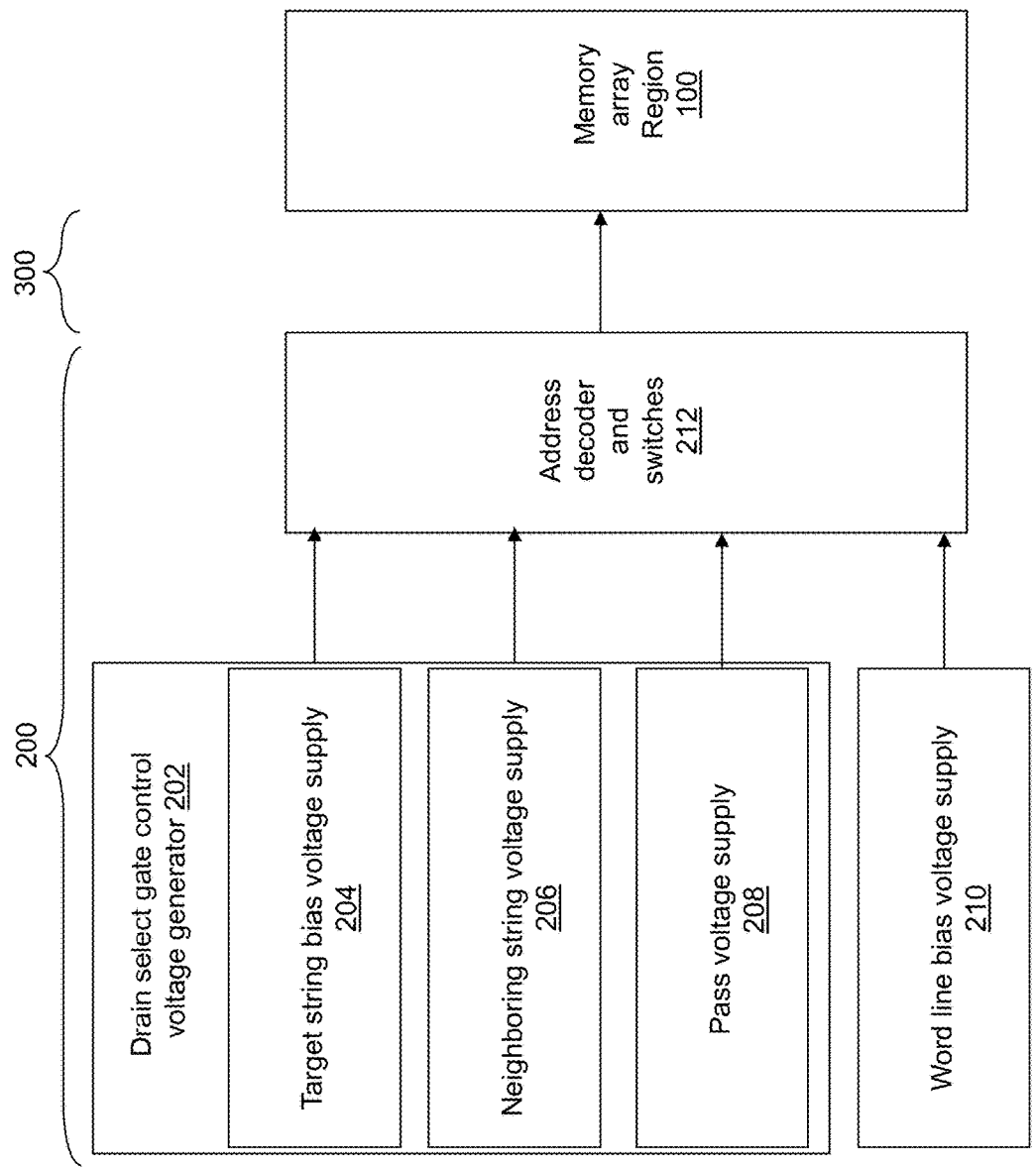
FIG. 18 is a schematic of a circuitry for providing various programming voltages to various nodes within the memory array of the three-dimensional memory device according to an embodiment of the present disclosure.

Referring FIG. 18, a schematic of a circuitry is illustrated for providing various programming voltages to various nodes within the memory array of the three-dimensional memory device of the present disclosure. The peripheral device region 200 contains word line driver circuitry, which can include a drain select gate control voltage generator circuitry 202 which can include one or more voltage supply sub-units, such as target string bias voltage supply circuitry 204, neighboring group voltage supply circuitry 206 and pass voltage supply circuitry 208. The peripheral device region 200 can also include a word line bias voltage supply circuitry 210 and address decoder and switches 212 which connect the voltage supplies (204, 206, 208, 210) via the contact region 300 to the memory array region 100.

According to an aspect of the present disclosure, a three-dimensional memory device can include an alternating stack of insulating layers 32 and electrically conductive layers 46 located over a substrate (9, 10), and memory stack structures 55 extending through the alternating stack (32, 42). Each of the memory stack structures 55 includes a memory film 50 that surrounds a vertical semiconductor channel 60. The memory stack structures 55 are arranged in multiple groups (S0-S3) that are laterally spaced apart by drain select level isolation structures 72 at each drain select level (which may be a single drain select level or multiple drain select levels). At least one row of memory stack structures 55 directly contacts a respective one of the drain select level isolation structures 72 in each of the multiple groups.

Referring to all drawings of the present disclosure, including FIGS. 15 and 18, the three-dimensional memory device can include a drain select gate control voltage generator, which is a part of a control circuitry configured to provide charge injection into the memory films 50 at the drain select level(s). The drain select gate control voltage generator can include a target string bias voltage supply circuitry configured to generate a target string bias voltage V_tgt, a neighboring string bias voltage supply circuitry configured to generate a neighboring string bias voltage V_ns, and a pass bias voltage supply circuitry configured to generate a pass bias voltage V_pass. The neighboring string bias voltage V_ns is different from the pass bias voltage V_pass. The control circuitry can further include a programming drain bias voltage circuitry configured to generate a programming drain bias voltage, and an address decoder and switch circuitry. The address decoder and switch circuitry can be configured to apply the target string bias voltage V_tgt to a selected drain select gate electrode layer section 46DS, to apply the neighboring string bias voltage V_ns to a first unselected drain select gate electrode layer section 46D1 that contacts a first one 721 of the drain select level isolation structures 72 that contacts the selected drain select gate electrode layer section 46DS, to apply the pass bias voltage V_pass to a second unselected drain select gate electrode layer section 46D2 that is laterally spaced from the selected drain select gate electrode layer section 46DS by at least one group (such as another first unselected neighboring group), and to apply the programming drain bias voltage to a vertical semiconductor channel 60 within a selected memory stack structure 55S laterally surrounded by the selected drain select gate electrode layer section 46DS.

In one embodiment, the neighboring string bias voltage V_ns can be in a range from 101% to 150% of the programming bias voltage, and the pass bias voltage V_pass can be in a range from 20% to 50% of the programming bias voltage.

In one embodiment, the three-dimensional memory device can further include a pair of dielectric material portions (such as insulating spacers 74) that laterally extend along a first horizontal direction hd1 and located on either side of the alternating stack (32, 42). The electrically conductive layers 46 can include word line electrically conductive layers 46W that laterally extend between the pair of dielectric material portions 74. The drain select level isolation structures 72 are located between the pair of dielectric material portions 74 and laterally extend along the first horizontal direction hd1 and laterally separate drain select gate electrode layer sections 46D. Each of the drain select level isolation structures 72 generally extends along the first horizontal direction hd1 and includes a pair of lengthwise sidewalls. Each of the pair of lengthwise sidewalls includes an alternating sequence of planar sidewalls (that may contact a drain select gate electrode) and concave vertical sidewalls. Each of the concave vertical sidewalls contacts a convex vertical sidewall of a respective one of the memory stack structures 55.

Referring to FIGS. 14A, 14B and 15, in one embodiment of the present disclosure, a three-dimensional memory device includes an alternating stack (32, 46) of insulating layers 36 and electrically conductive layers 46 located over a substrate (9, 10). The electrically conductive layers 46 comprise drain select gate electrodes 46 located over word line electrically conductive layers 46W. Memory stack structure 55 extend through the alternating stack (32, 46). Each of the memory stack structures 55 comprises a memory film 50 that surrounds a vertical semiconductor channel 60. The memory stack structures 55 are arranged in multiple groups (S0, S1, S2, S3) that are laterally spaced apart by drain select level isolation structures 72 at a level of the drain select gate electrode layer section 46D. At least one row of memory stack structures 55 is partially surrounded by a respective drain select gate electrode layer section 46D. Drain regions 63 contact a top end of a respective one of the vertical semiconductor channels 60. Bit lines 108 are electrically shorted a respective subset of the drain regions 63 such that each bit line 108 is electrically shorted to only one drain region 63 per each neighboring pair of groups (e.g., (S1, S2), (S2, S3), etc.). However, each bit line 108 is electrically shorted to more than one drain region 63 in a first memory block 400.

In one embodiment, a pair of dielectric material portions 74 laterally extend along a first horizontal direction hd1 (e.g., word line direction) in the backside trenches 79, and are located on either side of the alternating stack (32, 46) to separate the first memory block 400 from adjacent memory blocks.

In one embodiment, each bit line 108 is electrically shorted to two drain regions 63 in the first memory block 400, the word line electrically conductive layers 46 laterally extend in the first memory block 400 between the pair of dielectric material portions 74.

In one embodiment, the drain select level isolation structures 72 are located in the first memory block 400 between the pair of dielectric material portions 74. The drain select level isolation structures laterally extend along the first horizontal direction hd1 and laterally separate drain select gate electrode layer sections 46D and the multiple groups (S0-S3), but do not separate the word line electrically conductive layers 46.

In one embodiment, at least one row of memory stack structures 55 directly contacts a respective one of the drain select level isolation structures 72 in each of the multiple groups (S0-S3), each of the drain select level isolation structures 72 includes a pair of lengthwise sidewalls and each of the pair of lengthwise sidewalls includes an alternating sequence of planar sidewalls and concave vertical sidewalls. Each of the concave vertical sidewalls directly contacts a respective one of the memory stack structures 55.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of operating a three-dimensional memory device comprising a stack of alternating insulating layers and electrically conductive layers located over a substrate, and memory stack structures extending through the stack in a vertical direction perpendicular to the layers and the substrate, wherein:
   each of the memory stack structures comprises a memory film that surrounds a vertical semiconductor channel;
   the electrically conductive layers comprise drain select gate electrode layers located over word line electrically conductive layers;
   the memory stack structures are arranged in multiple groups that are spaced apart from each other in a horizontal direction by drain select level isolation structures that each extend in the vertical direction through the drain select gate electrode layers dividing each drain select gate electrode layer into horizontal drain select gate electrode layer sections;
   within each group of memory stack structures, at least one row of memory stack structures is arranged, each of the memory stack structures in the at least one row is only partially surrounded by a respective drain select gate electrode layer section due to each of the memory stack structures in the at least one row also directly contacting a respective one of the drain select level isolation structures;
   applying a target string bias voltage to a selected drain select gate electrode layer section, which partially surrounds a first row of memory stack structures in a respective group of memory stack structures, wherein each of the memory stack structures of the first row is in direct contact with a first one of the drain select isolation structures; and
   applying a neighboring string bias voltage, which has a greater magnitude than the target string bias voltage, to a first unselected drain select gate electrode layer section that neighbors the selected drain gate electrode layer section and contacts the first one of the drain select level isolation structures.

2. The method of claim 1, wherein:
   a selected memory stack structure is located in the first row of memory stack structures, and directly contacts the first one of the drain select isolation structures;
   the selected memory stack structure is located in a selected group of the multiple groups;
   the first unselected drain select gate electrode layer section is located in a first neighboring group that is adjacent to the selected group and that is separated from the selected group by the first one of the drain select isolation structures;
   the selected drain select gate electrode layer section partially surrounds the selected memory stack structure in a drain select level;
   electrical charge is injected into a first portion of a memory film in the selected memory stack structure that contacts the selected drain select gate electrode layer section by the target string bias voltage; and electrical charge is injected into a second portion of the memory film in the select memory stack structure that contacts the first one of the drain select isolation structures by the neighboring string bias voltage.

3. The method of claim 2, further comprising:

applying a pass bias voltage to a second unselected drain select gate electrode layer section that is laterally spaced from the selected drain select gate electrode layer section by at least the first neighboring group; and applying a programming drain bias voltage to a drain region which contacts a vertical semiconductor channel within the selected memory stack structure, wherein the neighboring string bias voltage greater than the pass bias voltage.

4. The method of claim 3, wherein:

the neighboring string bias voltage is in a range from 101% to 150% of the target string bias voltage; and the pass bias voltage is in a range from 20% to 50% of the target string bias voltage.

5. The method of claim 3, wherein:

the target string bias voltage is in a range from 9 V to 30 V;

the neighboring string bias voltage is in a range from 9.5 V to 45 V;

the pass bias voltage is in a range from 3 V to 22.5 V; and the programming drain bias voltage is in a range from −1 V to 2 V.

6. The method of claim 2, wherein the three-dimensional memory device further comprises:

drain regions contacting a top end of a respective one of the vertical semiconductor channels; and bit lines that are electrically shorted to a respective subset of the drain regions such that each bit line is electrically shorted to only one drain region per each neighboring pair of strings groups, and each bit line is electrically shorted to more than one drain region in each memory block.

7. The method of claim 6, further comprising applying a neighboring string inhibit voltage to each bit line electrically connected to vertical semiconductor channels that pass through the first unselected drain select gate electrode layer section during charge injection into the memory film of the selected memory stack structure, wherein a voltage difference between the neighboring string inhibit voltage and the pass bias voltage is less than a critical voltage that induces charge tunneling through memory films within the memory stack structures.

8. The method of claim 7, wherein:

the selected drain select gate electrode layer section contacts a second one of the drain select level isolation structures;

an additional first unselected drain select gate electrode layer section contacts the second one of the drain select level isolation structures; and the method further comprises applying the neighboring string inhibit voltage to each bit line electrically connected to vertical semiconductor channels that pass through the additional first unselected drain select gate electrode layer section during charge injection into the memory film within the selected memory stack structure.

9. The method of claim 7, further comprising applying a selected string inhibit voltage to each bit line connected to vertical semiconductor channels of unselected memory stack structures that pass through the selected drain select gate electrode layer section, wherein the selected string inhibit voltage is greater than the programming drain bias voltage and prevents charge tunneling within the unselected memory stack structures.

10. The method of claim 7, further comprising applying the programming drain bias voltage each bit line connected to vertical semiconductor channels of additional memory stack structures that pass through the selected drain select gate electrode layer section.

11. The method of claim 2, wherein charge trapping is induced within the portions of the memory film in the selected memory stack structure that are located at the drain select level while word line electrically conductive layers among the electrically conductive layers are electrically biased at a voltage that does not induce charge tunneling through the memory film in the selected memory stack structure.

12. The method of claim 11, further comprising storing electrical charges in memory elements within the memory film in the selected memory stack structure in a subsequent programming operation or reading electrical charges in memory elements within the memory film in the selected memory stack structure in a subsequent reading operation.

13. The method of claim 1, wherein:

the three-dimensional memory device further comprises a pair of dielectric material portions that laterally extend along an additional horizontal direction and that are located on either side of the stack to separate a selected memory block containing the selected memory group and the neighboring memory group from adjacent memory blocks;

the word line electrically conductive layers laterally extend in the selected memory block between the pair of dielectric material portions;

the drain select level isolation structures are located in the selected memory block between the pair of dielectric material portions; and the drain select level isolation structures laterally separate drain select gate electrode layer sections and the multiple strings groups, but do not separate the word line electrically conductive layers.

14. The method of claim 13, wherein:

each of the drain select level isolation structures laterally extends along the additional horizontal direction and includes a pair of lengthwise sidewalls;

each of the pair of lengthwise sidewalls includes an alternating sequence of planar sidewalls and concave vertical sidewalls; and each of the concave vertical sidewalls directly contacts a respective one of the memory stack structures.

15. The method of claim 1, wherein:

the target string bias voltage is applied as multiple pulses to the selected drain select gate electrode layer section; and the neighboring string bias voltage is applied as multiple pulses to the first unselected drain select gate electrode layer section.

16. The method of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the word line electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

17. A three-dimensional memory device, comprising:

a stack of alternating insulating layers and electrically conductive layers located over a substrate, wherein the electrically conductive layers comprise drain select gate electrode layers located over word line electrically conductive layers;

memory stack structures extending through the stack in a vertical direction perpendicular to the layers and the substrate, wherein each of the memory stack structures comprises a memory film that surrounds a vertical semiconductor channel, the memory stack structures are arranged in multiple groups that are spaced apart from each other in a horizontal direction by drain select level isolation structures that each extend in the vertical direction through the drain select gate electrode layers dividing each of the drain select gate electrode layers into horizontal drain select gate electrode layer sections, and within each group of memory stack structures, at least one row of memory stack structures is arranged, each of the memory stack structures in the at least one row is only partially surrounded by a respective drain select gate electrode layer section due to each of the memory stack structures in the at least one row also directly contacting a respective one of the drain select level isolation structures; drain regions contacting a top end of a respective one of the vertical semiconductor channels; and bit lines that are electrically shorted to a respective subset of the drain regions such that each bit line is electrically shorted to only one drain region per each neighboring pair of groups of memory stack structures, and each bit line is electrically shorted to more than one drain region in a first memory block.

18. The three-dimensional memory device of claim 17, further comprising a pair of dielectric material portions that laterally extend along an additional horizontal direction and that are located on either side of the stack to separate the first memory block from adjacent memory blocks.

19. The three-dimensional memory device of claim 18, wherein:

each bit line is electrically shorted to two drain regions in the first memory block;

the word line electrically conductive layers laterally extend in the first memory block between the pair of dielectric material portions;

the drain select level isolation structures are located in the first memory block between the pair of dielectric material portions;

the drain select level isolation structures laterally extend along the additional horizontal direction and laterally separate drain select gate electrode layer sections and the multiple groups, but do not separate the word line electrically conductive layers;

at least one row of memory stack structures directly contacts a respective one of the drain select level isolation structures in each of the multiple groups;

each of the drain select level isolation structures includes a pair of lengthwise sidewalls;

each of the pair of lengthwise sidewalls includes an alternating sequence of planar sidewalls and concave vertical sidewalls; and each of the concave vertical sidewalls directly contacts a respective one of the memory stack structures.

20. A three-dimensional memory device, comprising:

a stack of alternating insulating layers and electrically conductive layers located over a substrate, wherein the electrically conductive layers comprise drain select gate electrode layers located over word line electrically conductive layers;

memory stack structures extending through the stack in a vertical direction perpendicular to the layers and the substrate, wherein each of the memory stack structures comprises a memory film that surrounds a vertical semiconductor channel, wherein the memory stack structures are arranged in multiple groups that are spaced apart from each other in a horizontal direction by drain select level isolation structures that each extend in the vertical direction through the drain select gate electrode layers dividing each drain select gate electrode layer into drain select gate electrode layer sections, and wherein at least one row of memory stack structures is arranged, each of the memory stack structures in the at least one row is only partially surrounded by a respective drain select gate electrode layer section due to each of the memory stack structures in the at least one row also directly contacting a respective one of the drain select level isolation structures; and a control circuitry configured to provide charge injection into the memory films at the level of the drain select gate electrode layers, wherein the control circuitry comprises:

a target string bias voltage supply circuitry configured to generate a target string bias voltage; a neighboring string bias voltage supply circuitry configured to generate a neighboring string bias voltage;

a pass bias voltage supply circuitry configured to generate a pass bias voltage, wherein the neighboring string bias voltage is different from the pass bias voltage;

a programming drain bias voltage circuitry configured to generate a programming drain bias voltage; and an address decoder and a switch circuitry that are configured:

to apply the target string bias voltage to a selected drain select gate electrode layer section, which partially surrounds a first row of memory stack structures in a respective group of memory stack structures, wherein each of the memory stack structures of the first row is in direct contact with a first one of the drain select isolation structures;

to apply the neighboring string bias voltage to a first unselected drain select gate electrode layer section that that neighbors the selected drain select gate electrode layer section and contacts a first one of the drain select level isolation structures;

to apply the pass bias voltage to a second unselected drain select gate electrode layer section that is spaced from the selected drain select gate electrode layer section in the horizontal direction by the at least one select gate electrode layer section; and to apply the programming drain bias voltage to a vertical semiconductor channel within a selected memory stack structure at least partially laterally surrounded by the selected drain select gate electrode layer section.

21. The three-dimensional memory device of claim 20, wherein:
the neighboring string bias voltage is in a range from 101% to 150% of the programming bias voltage; and
the pass bias voltage is in a range from 20% to 50% of the programming bias voltage.

22. The three-dimensional memory device of claim 20, further comprising a pair of dielectric material portions that laterally extend along an additional horizontal direction and located on either side of the stack,
wherein:
the electrically conductive layers comprise word line electrically conductive layers that laterally extend between the pair of dielectric material portions;
the drain select level isolation structures are located between the pair of dielectric material portions and laterally extend along the additional horizontal direction and laterally separate drain select gate electrode layer sections;
each of the drain select level isolation structures generally extends along the additional horizontal direction and includes a pair of lengthwise sidewalls;
each of the pair of lengthwise sidewalls includes an alternating sequence of planar sidewalls and concave vertical sidewalls; and
each of the concave vertical sidewalls contacts a respective one of the memory stack structures.

* * * * *